United States Patent [19]

Kuroda et al.

[11] Patent Number: 5,205,032
[45] Date of Patent: Apr. 27, 1993

[54] ELECTRONIC PARTS MOUNTING APPARATUS

[75] Inventors: Fumihiko Kuroda, Tokyo; Hideto Furuyama, Yokohama; Mayumi Sakaguchi, Tokyo; Hiroshi Hamasaki, Sagamihara; Masaru Nakamura, Kawaguchi, all of Japan

[73] Assignee: Kabushiki Kaisha Toshiba, Kawasaki, Japan

[21] Appl. No.: 766,204

[22] Filed: Sep. 27, 1991

[30] Foreign Application Priority Data

Sep. 28, 1990 [JP] Japan .................... 2-259036
Jul. 3, 1991 [JP] Japan .................... 3-162821
Aug. 23, 1991 [JP] Japan .................... 3-211846

[51] Int. Cl.⁵ .............. H05K 1/18; H05K 3/30; B23P 19/00
[52] U.S. Cl. .................................... 29/740; 29/760; 361/401
[58] Field of Search ............... 29/739, 740, 760, 830, 29/834; 361/397, 401, 402

[56] References Cited

U.S. PATENT DOCUMENTS

| | | | |
|---|---|---|---|
| 3,520,054 | 7/1970 | Pensack et al. | 29/830 X |
| 4,627,161 | 12/1986 | Cushman | 29/741 X |
| 4,860,442 | 8/1989 | Ainsworth et al. | 29/830 X |
| 4,875,285 | 10/1989 | Ogata et al. | 29/830 |
| 5,046,238 | 8/1991 | Daigle et al. | 29/739 X |

FOREIGN PATENT DOCUMENTS 54-18692 2/1979 Japan.

Primary Examiner—Timothy V. Eley
Attorney, Agent, or Firm—Oblon, Spivak, McClelland, Maier & Neustadt

[57] ABSTRACT

An electronic parts mounting device according to this invention is characterized by including a mount body which is obtained by bonding at least two substrates each having a predetermined thicknesses and a smooth surface and which has at least one bonding portion, the mount body having at least one recessed portion selectively formed in one exposed surface of the mount body to reach the bonding portion, and the recessed portion having a tapered shape widened from the bonding portion to the exposed surface, and an electronic part mounted in the recessed portion.

18 Claims, 17 Drawing Sheets

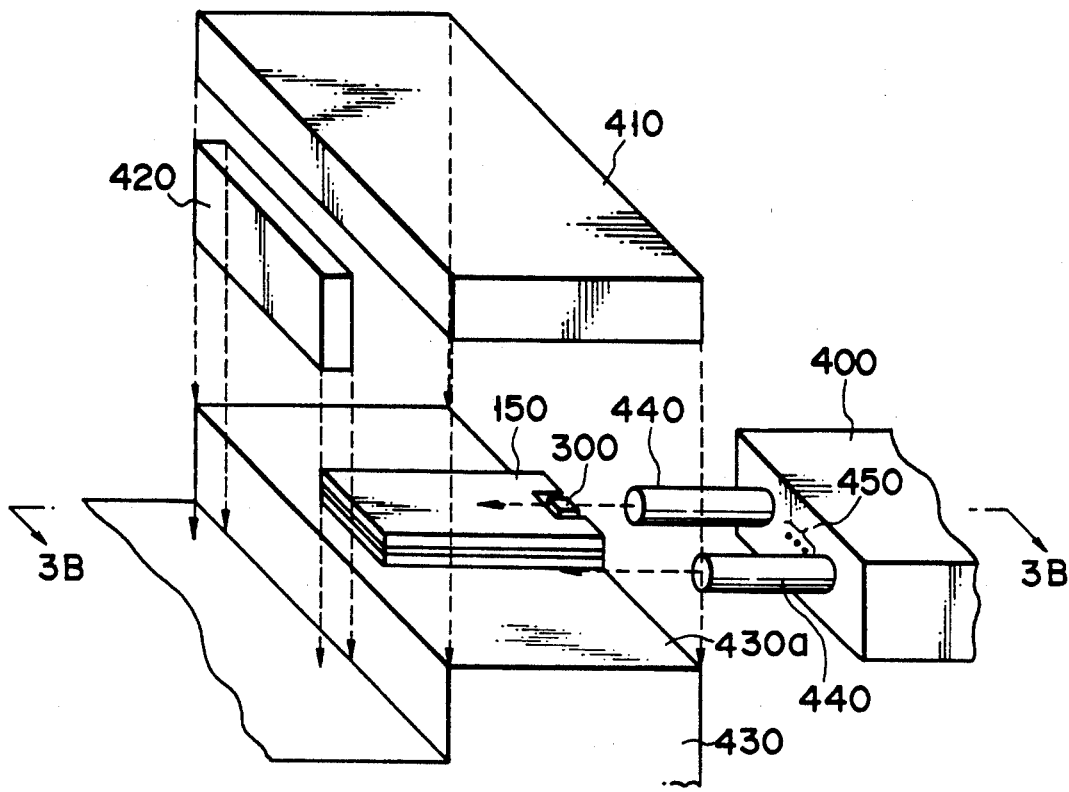
F I G. 3A
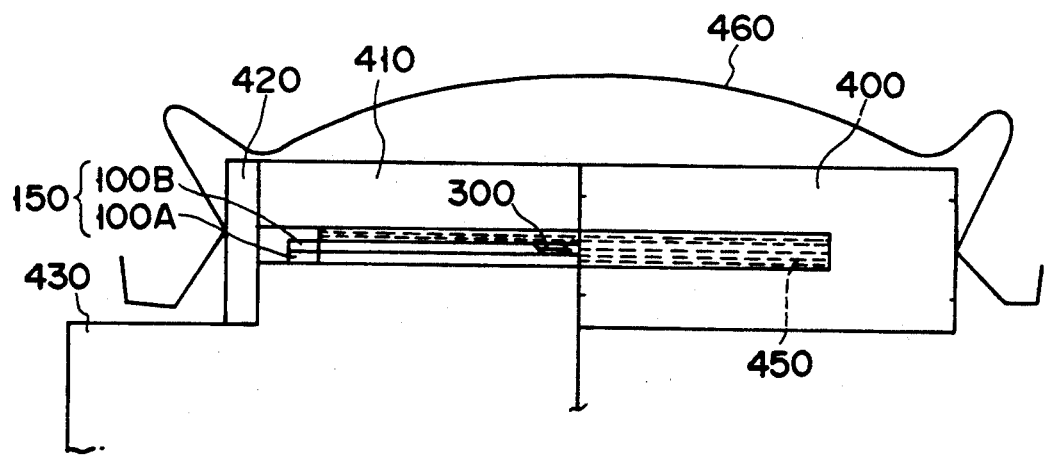
F I G. 3B

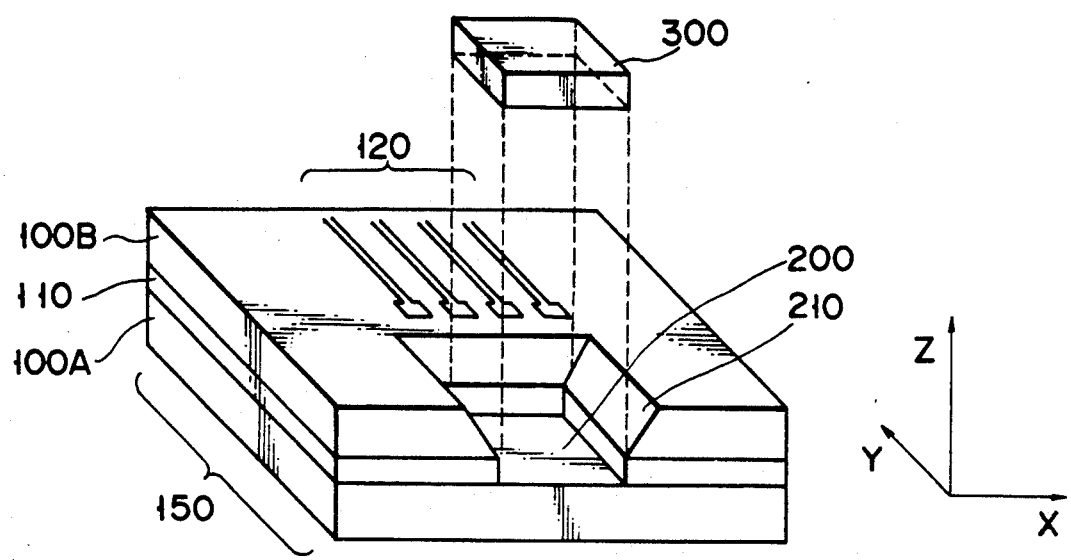
F I G. 4

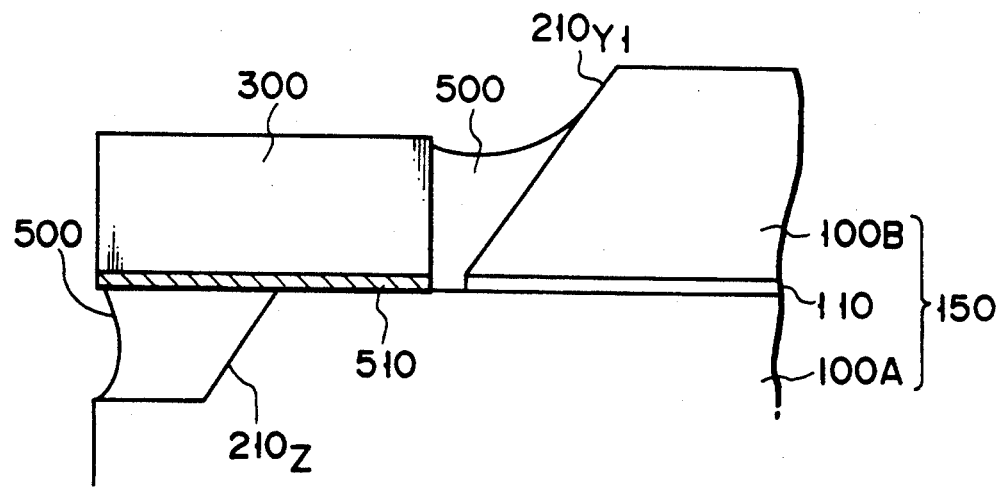
F I G. 5D
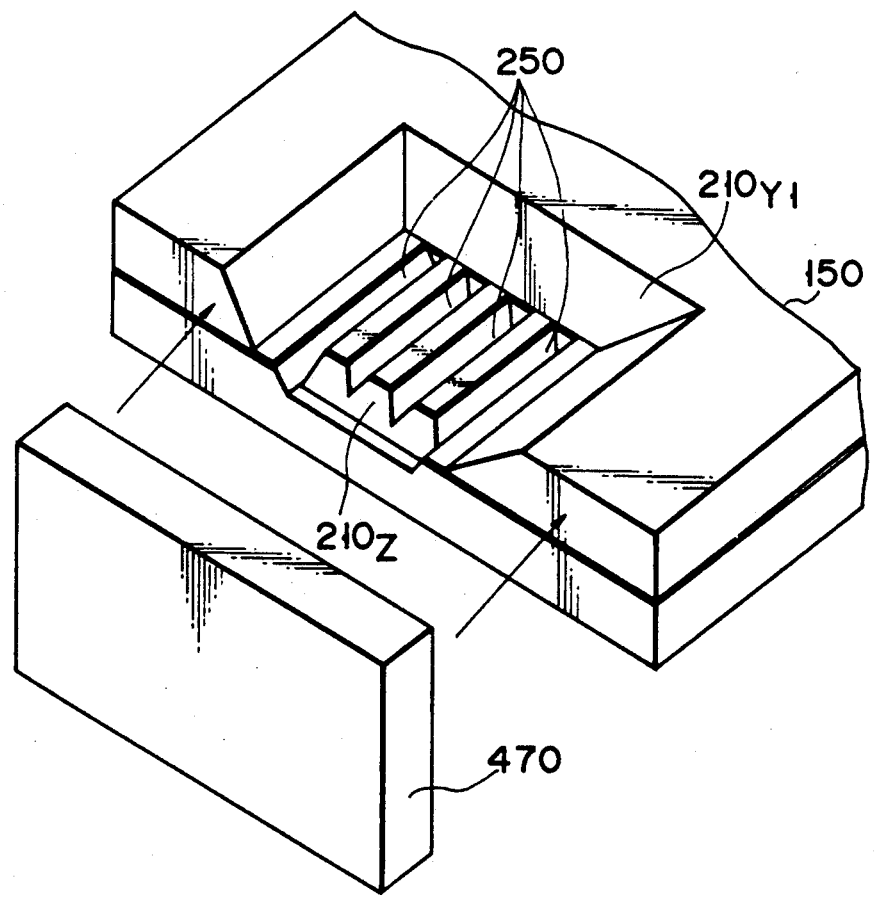
F I G. 6

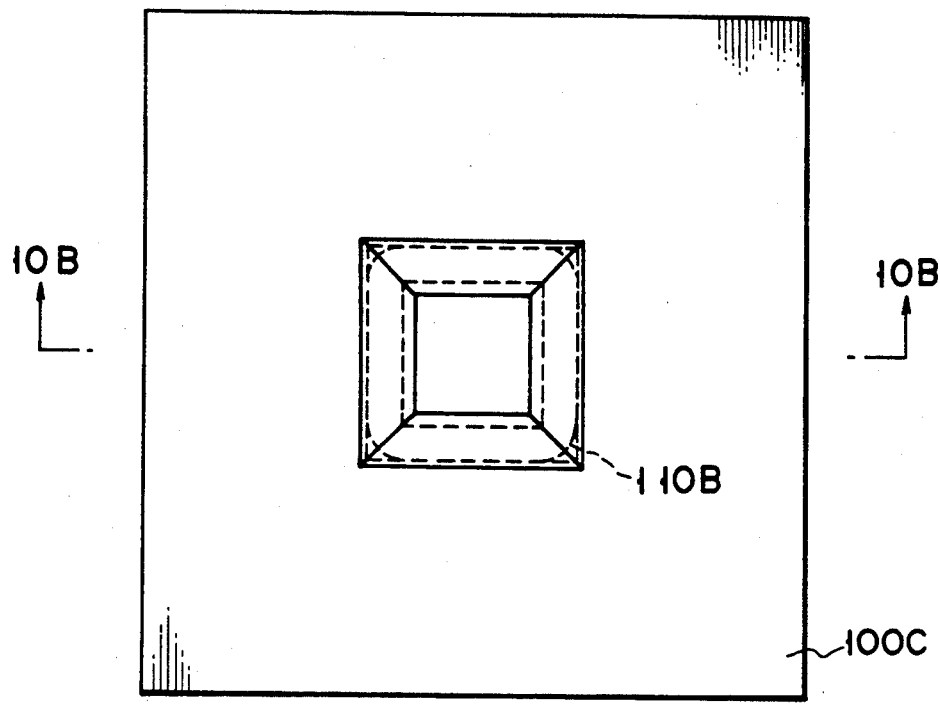
F I G. 10A
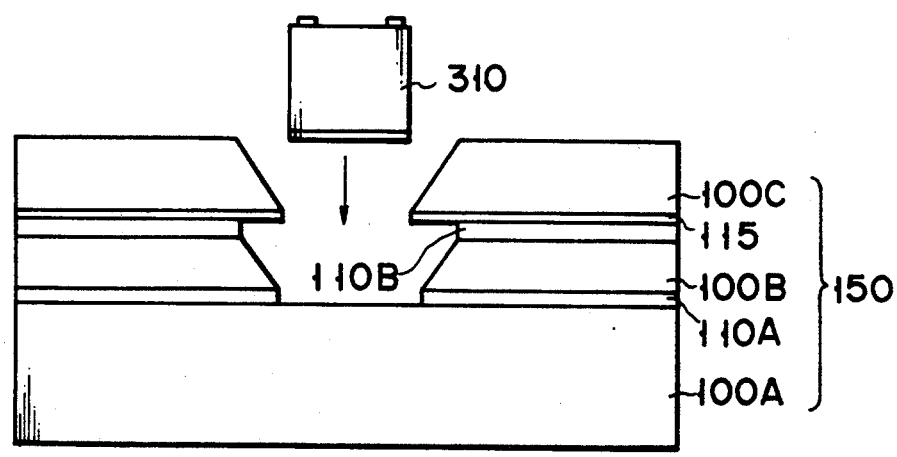
F I G. 10B

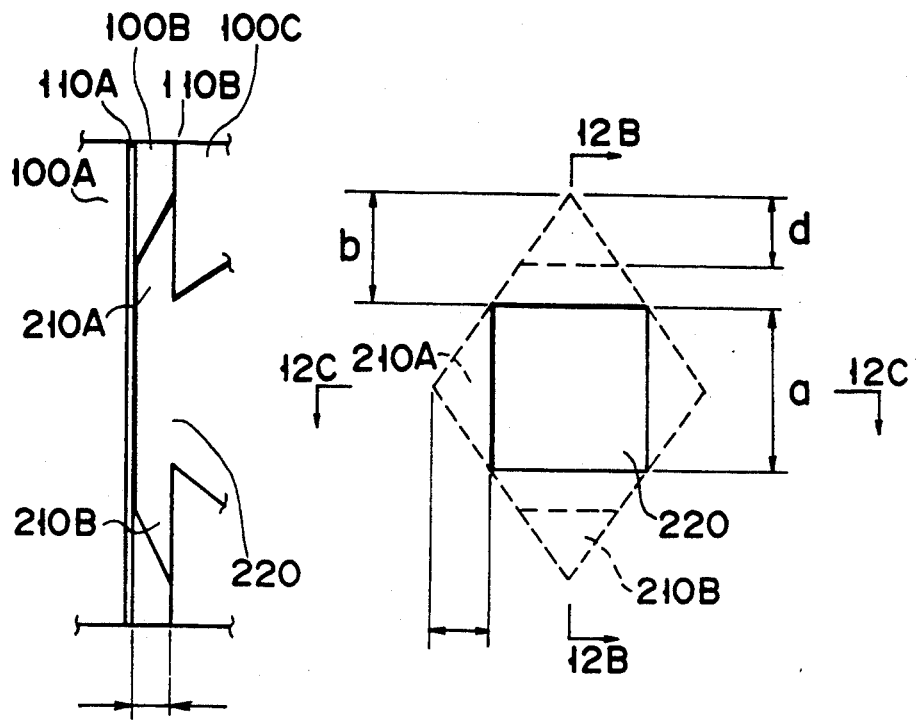
FIG. 12A
FIG. 12B
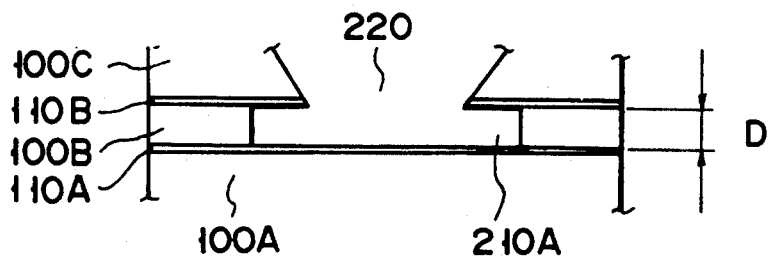
FIG. 12C

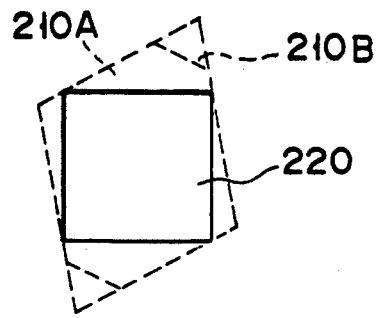
F I G. 13A
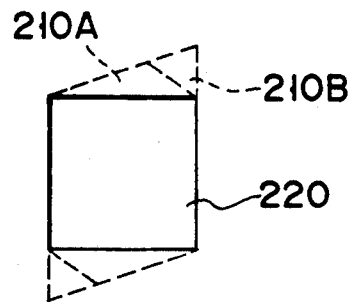
F I G. 13B
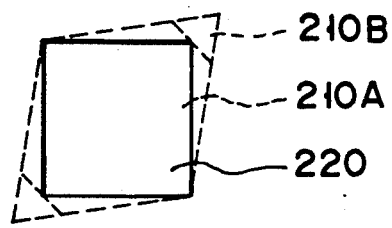
F I G. 13C

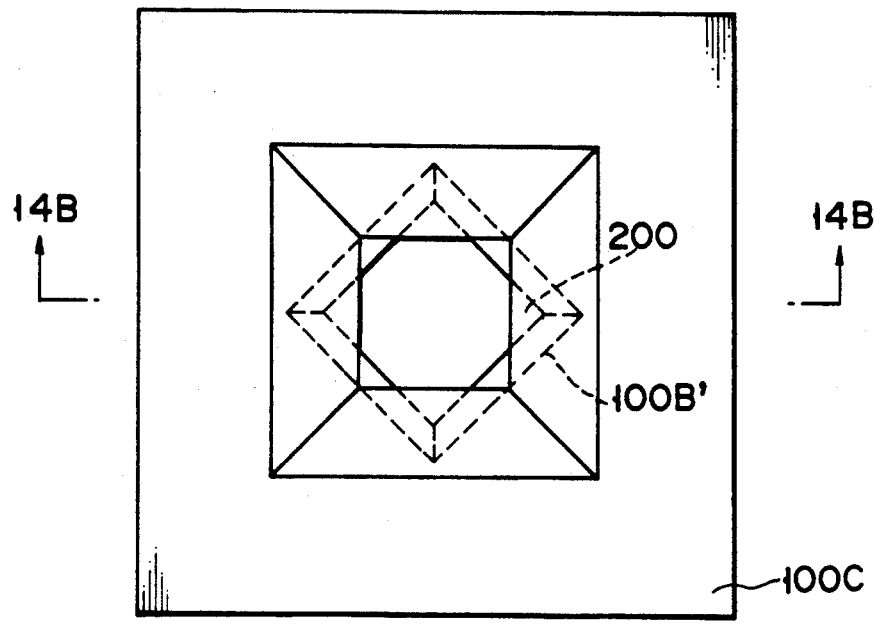
F I G. 14A
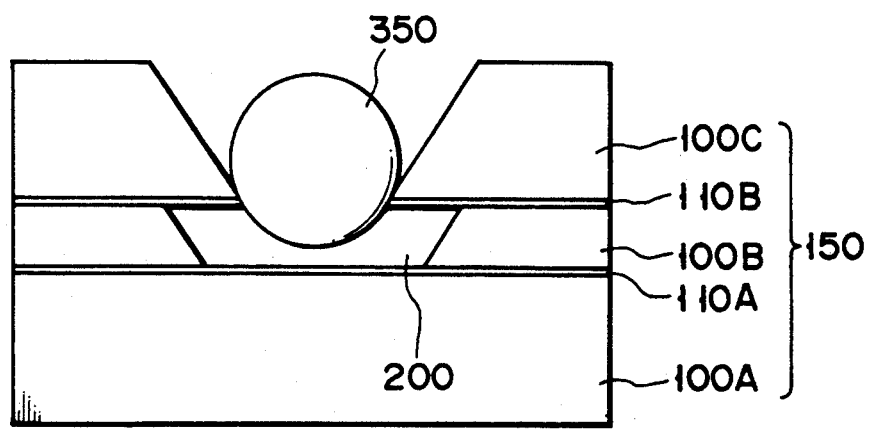
F I G. 14B

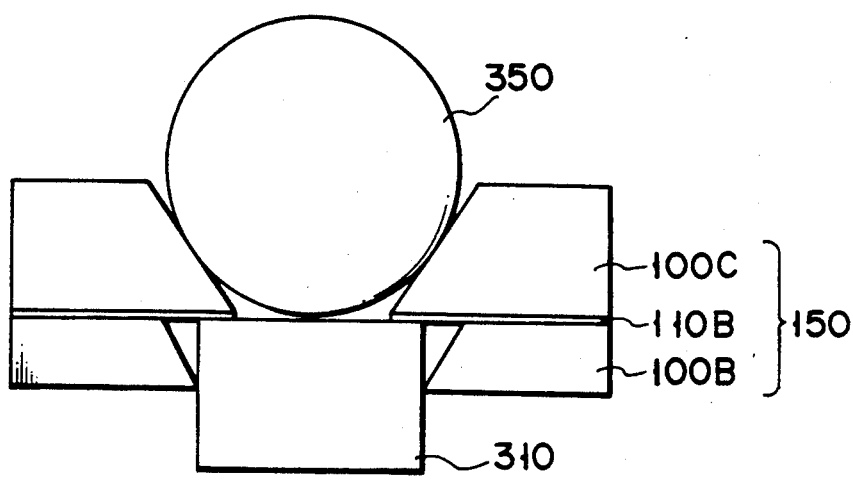
F I G. 15

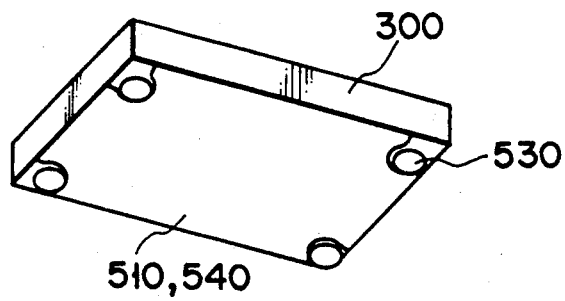
F I G. 16A
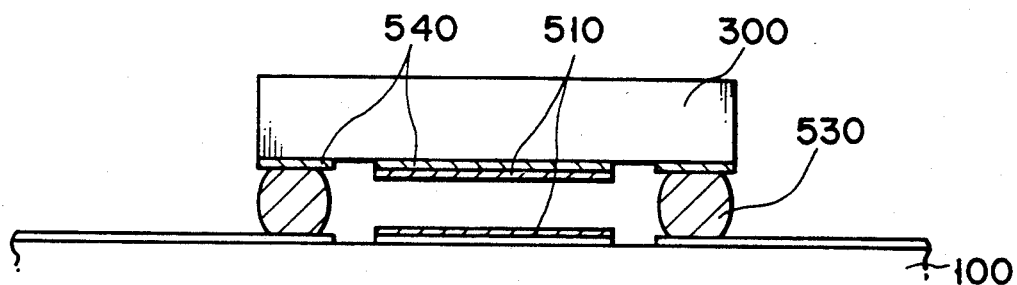
F I G. 16B
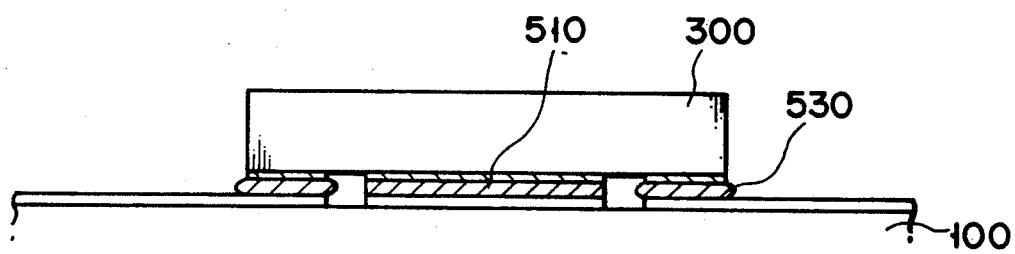
F I G. 16C

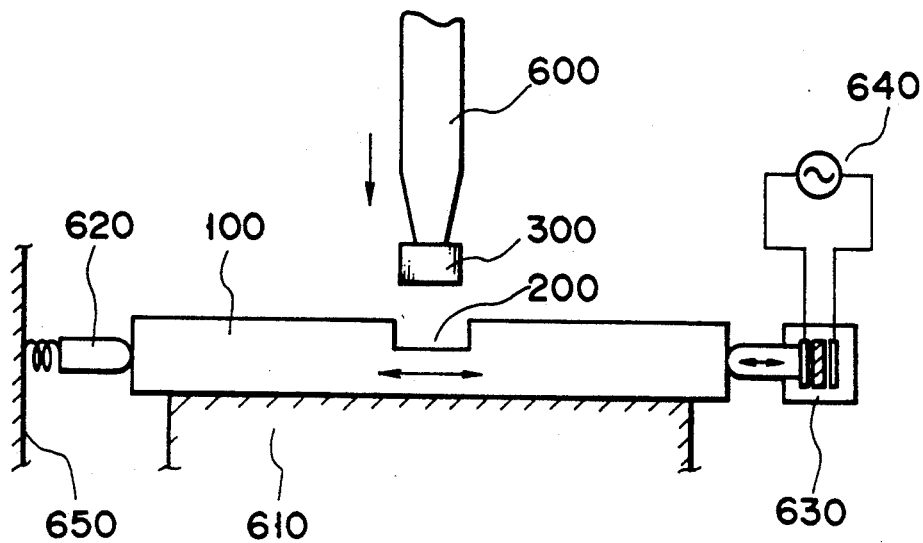
F I G. 17
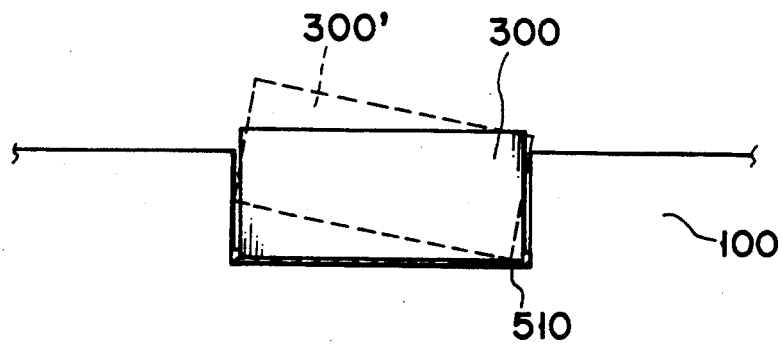
F I G. 18

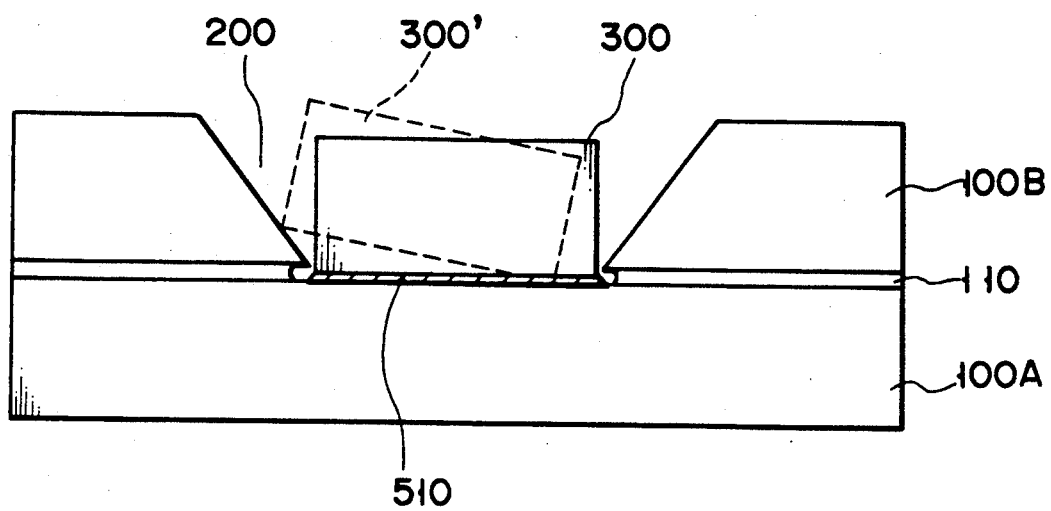
F I G. 19
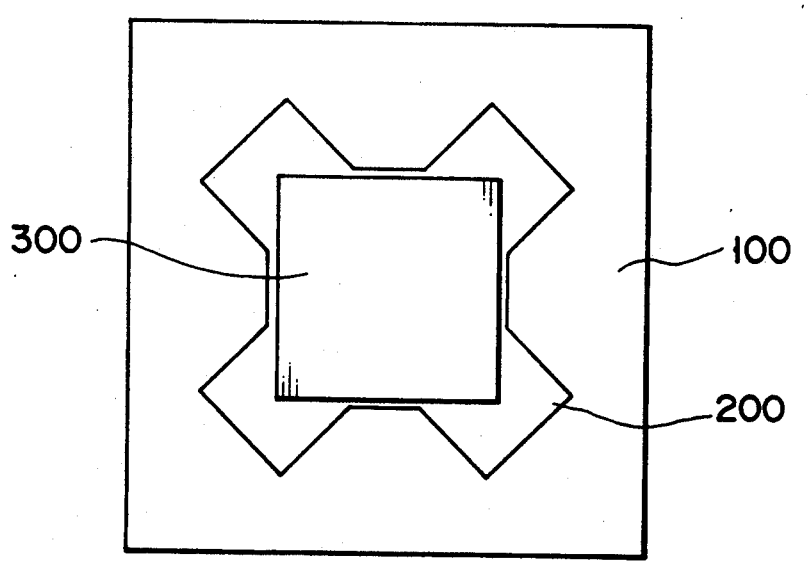
F I G. 20

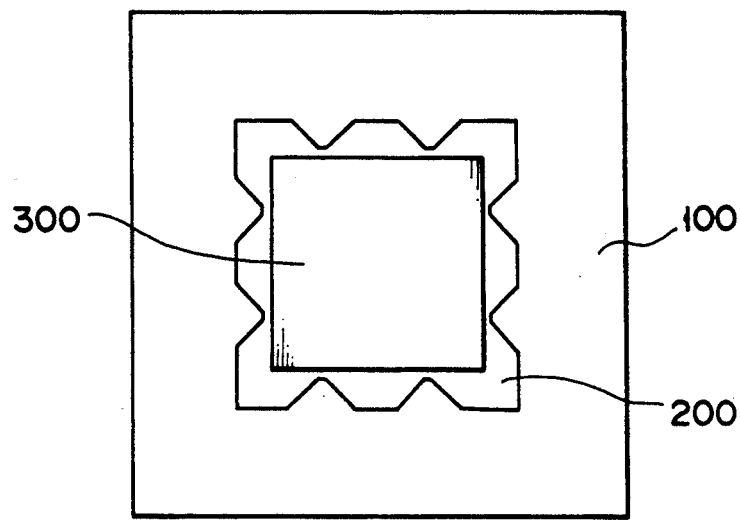
F I G. 21
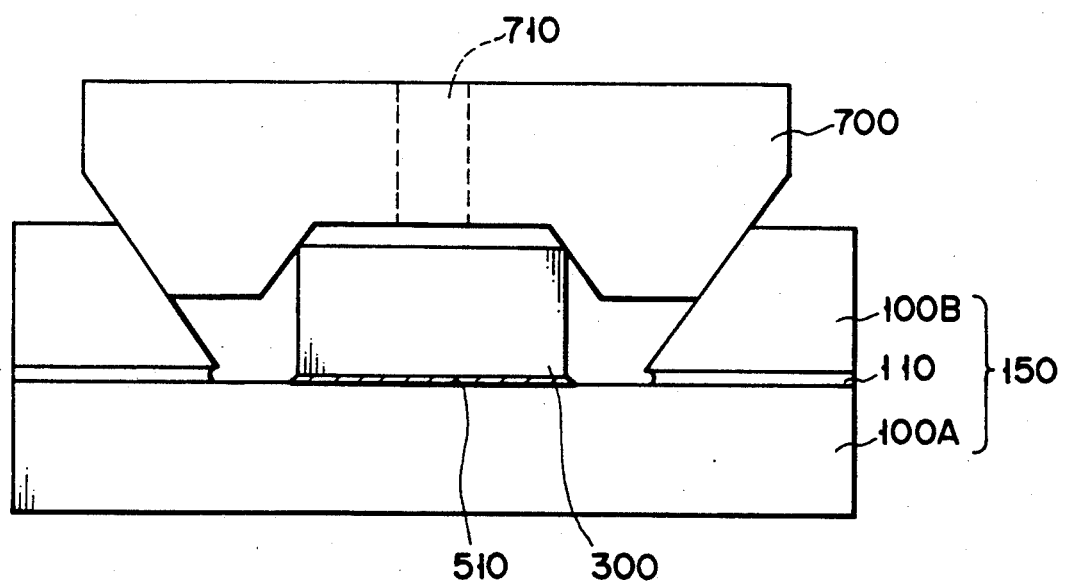
F I G. 22

ELECTRONIC PARTS MOUNTING APPARATUS

BACKGROUND OF THE INVENTION

1. Field of the Invention

The present invention relates to a technique for mounting an electronic part, e.g., a semiconductor laser element, in a recessed portion of a substrate and, more particularly, to ah electronic parts mounting apparatus utilizing mechanical self-alignment and a method of mounting electronic parts.

2. Description of the Related Art

Mechanical position alignment is needed in IC element flip chip mounting, optical axis adjustment of an optical semiconductor element for optical communication, and the like. Particularly, in optical axis adjustment and the like of an optical fiber array and an optical element array, a total of 6 axes comprising X-, Y-, and Z-axes and rotational axes ($\theta_X$, $\theta_Y$, and $\theta_Z$) corresponding thereto need be adjusted. Such a mechanical alignment step requires a large amount of labor in obtaining and maintaining an alignment precision, and time required for alignment causes an extra cost. Therefore, simplified mechanical alignment, especially self-alignment is strongly demanded.

In the manufacture of a lower-profile IC card, a method is practiced in which an element is fitted in a hole of a substrate and the entire structure is molded with a resin. With this method, however, since only the resin supports the element, the mechanical strength is low.

A structure is known in which a flat waveguide material is formed on an Si substrate and functional portions of the flat waveguide and holder portions are collectively formed by photolithography. For this purpose, a method is employed which enables mounting in a self-alignment manner by accurately aligning the optical axes of the waveguide and the holder portions and fitting a light-emitting element and a spherical lens in the corresponding holder portions.

Although this method enables self-alignment in principle, sufficient self-alignment is not yet enabled in practice.

When almost ideal assembly is performed by this method, to perform complete self-alignment, the clearance is preferably zero. In practice, however, the clearance must be small by considering upward warp and the like due to the thermal expansion coefficients of the respective members and solder capillarity.

Conventionally, mounting and assembly as described above are performed by stationarily holding a substrate, holding a semiconductor element by vacuum chucking or the like and moving the chucked semiconductor element, and mounting the semiconductor element on the substrate. However, the clearance largely influences the yield of the assembly. That is, when the clearance is as small as 10 to 20 μm, it is difficult to insert the semiconductor element in the holder portion. Therefore, the semiconductor element is caught to be inclined or cracked. When the clearance is small, even if catching of the semiconductor element does not occur, the holder portion and a side surface of the semiconductor element often locally contact so as to be stopped by each other, causing a local stress. As a result, when the clearance is small, although the alignment precision can be easily improved, the yield in assembly tends to be decreased and reliability of the semiconductor element after mounting tends to be degraded.

On the other hand, when the clearance is set large (e.g., 50 to 100 μm) in order to avoid catching of the semiconductor element or local contact thereof with the holder portion, the precise self-alignment as the initial object becomes difficult. That is, when the clearance is large, the assembly alignment of the semiconductor element and the holder portion bears an error corresponding to the clearance at maximum, and the semiconductor element mounting angle (inclination of the element within the mounting plane) also easily bears an error. Hence, to increase the clearance between the semiconductor element and the holder portion is equivalent to render the self-alignment technique meaningless.

Even when the optimization of the clearance is performed by considering these two contradicting problems, the self-alignment still has a problem in view of precision. That is, when the clearance is set at, e.g., 30 to 40 μm, the alignment precision has a maximum error of ±15 to 20 μm, and thus it is difficult to apply this clearance to assembly of an optical fiber and a light-emitting element that allows an error of, e.g., ±2 to 5 μm in the case of a single mode fiber. An error in self-alignment should be ±5 μm or less considering the case of a light-emitting element and an optical fiber as well.

As described above, when the clearance between an electronic part, e.g., a semiconductor element, and a recessed portion of a substrate is set large, it is difficult to realize self-alignment; when the clearance is set small, the yield of assembly is decreased and reliability of the electronic part after mounting is degraded.

It is very important to mount a semiconductor element at an accurate position in a module, and it is strongly needed to overcome difficulties accompanying it. A method in which an element is buried in a hole of a substrate and molded with a resin in order to fabricate a low-profile device, has a low mechanical strength. A strong demand has arisen for increasing the mechanical strength.

Published Unexamined Japanese Patent Application Nos. 54-18692 and 61-87113 disclose known techniques associated with the present invention.

SUMMARY OF THE INVENTION

It is an object of the present invention to provide an electronic parts mounting method and apparatus which are capable of reliably and correctly mounting an electronic part in a recessed portion of a substrate without increasing a clearance between the electronic part and the recessed portion of the substrate and capable of increasing the manufacture yields and reliability by enabling substantial self-alignment mounting and, furthermore, to provide an electronic parts mount device capable of firmly supporting a semiconductor element even if the device is formed thin.

An electronic parts mounting device according to a first aspect of the present invention, wherein an electronic parts mounting device comprises a mount body which is obtained by bonding at least two substrates each having a predetermined thickness and a smooth surface and which has at least one bonding portion, the mount body having at least one recessed portion selectively formed in one exposed surface of the mount body to a depth to reach the bonding portion, and an electronic part mounted in the recessed portion.

When the bulk substrate comprises three or more substrates, if the recessed portion is formed to extend from an exposed surface portion of the mount body to a second bonding portion over a first bonding portion, it is preferable that the sectional area of the exposed surface portion of the recessed portion of the mount body is larger than the sectional area of each of the first and second bonding portions of the recessed portion. Accordingly, it is preferable that the electronic part and the recessed portion contact each other at the middle of or near the entrance of a side surface of the recessed portion, thereby positioning the electronic part. Furthermore, the same applies to a case in which the bulk substrate comprises two substrates and the recessed portion of one exposed surface portion extends to the other exposed surface portion over the bonding portion.

When the recessed portion is to be formed in the semiconductor substrate, its position in the horizontal direction can be accurately defined by using a normal masking step. However, with a normal etching step, it is difficult to correctly etch the recessed portion to an accurate depth while forming the bottom surface of the recessed portion flat.

In the first aspect of the present invention, since two substrates are bonded through an oxide film or the like, etching of the recessed portion in the depth direction is automatically stopped by the oxide film. As a result, the thickness of the substrate formed by polishing can be precisely controlled, and thus the recessed portion can be etched at an arbitrary position inside the substrate surface to have an accurate depth while leaving its bottom surface flat. By utilizing the accurately etched recessed portion, a semiconductor element can be mounted at a precise position both in the horizontal and vertical directions.

Furthermore, in mounting of the electronic part, after the electronic part is inserted in the recessed portion, a member having a predetermined surface tension is filled between a side surface of the recessed portion and the electronic part, and subsequently, the electronic part is bonded to a bottom surface of the recessed portion. As a result, even if the clearance between the electronic part and the recessed portion is large, the electronic part can be reliably set at a correct position because of the centering effect of the member having the surface tension. That is, the self-alignment effect of the various types of electronic parts mount bodies having a mechanical self-alignment mechanism can be exhibited as much as possible, and a great improvement in the alignment precision and simplification in the manufacturing process of the electronic parts mount body that needs precise alignment are enabled, and a great improvement in the reliability and cost reduction are enabled.

An electronic parts mounting device according to a second aspect of the present invention is characterized by an apparatus for mounting electronic parts comprising a substrate having a recessed portion for mounting an electronic part therein, the electronic part being machined to have a predetermined shape, holding means for holding the substrate, moving means for holding the electronic part and moving the electronic part to the recessed portion of the substrate, and vibration generating means for applying a small vibration to at least one of the substrate and the electronic part.

In the second aspect of the present invention, it is preferable that a vibration generating mechanism comprises an electromagnetic vibrating element or a piezoelectric vibrating element for converting an electrical vibration to a mechanical vibration, and furthermore, that the vibration generating mechanism generates an ultrasonic vibration.

A method of mounting electronic parts according to a third aspect of the present invention is characterized by a method of mounting an electronic part comprising the first step of forming a recessed portion in a substrate, the second step of inserting the electronic part in the recessed portion, the third step of filling a member having a predetermined surface tension between a side surface of the recessed portion and the electronic part, and the fourth step of bonding the electronic part to a bottom surface of the recessed portion.

In the third aspect of the present invention, it is preferable that a combined portion of a recessed portion of a substrate and an electronic part has a clearance of 10 $\mu$m or less.

A method of mounting electronic parts according to a fourth aspect of the present invention is characterized by a method of mounting an electronic part comprising the first step of forming a recessed portion in a substrate, the second step of inserting the electronic part in the recessed portion, and the third step of applying a small vibration to at least one of the substrate and the electronic part, thereby inserting the electronic part in the recessed portion.

In the fourth aspect of the present invention, it is preferable that a clearance where a recessed portion of a substrate and an electronic part are close to each other is 10 $\mu$m or more, and furthermore, that the recessed portion of the substrate is formed to have a tapered section such that its side close to the opening is widened.

According to the second to fourth aspects of the present invention, when a small vibration is imparted to at least one of the electronic part and the substrate, catching of the electronic part can be avoided and the electronic part can be properly set at a correct position even if the clearance between the electronic part and the recessed portion is small.

As described above in detail, according to the first aspect of the present invention, a recessed portion is formed in a mount body, obtained by bonding a plurality of substrates, to reach the substrate bonding portion, and a semiconductor element is mounted in the recessed portion. As a result, the positional relationship between the semiconductor element and other module constituent components can be accurately maintained, and the semiconductor element can be firmly mechanically supported. Furthermore, since the semiconductor element is supported by at least one semiconductor substrate, a higher mechanical strength can be obtained. It is easy to cut the semiconductor substrate at a predetermined position as required. When the semiconductor element is held at a predetermined position in the module, the positional relationship with other module components can be accurately set.

Furthermore, according to the second to fourth aspects of the present invention, when the centering effect of the member having a small vibration or surface tension is utilized, self-alignment mounting of an electronic part to a recessed portion, which needs mechanical precision alignment, is enabled, and the alignment precision can be remarkably improved. As a result, this technique contributes to a large increase in productivity and price reduction of an optical transmission module, a high-speed hybrid IC, and the like.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 3A is an exploded perspective view showing a case in which the laser module of FIG. 2B is applied to a laser module utilizing an MT connector;

FIG. 3B is a sectional view taken along the line 3B—3B of FIG. 3A;

FIG. 4 is a perspective view showing an arrangement of a substrate and an electronic part according to Embodiment 2;

FIGS. 5A to 5D are sectional views showing insertion states of the electronic part according to Embodiment 2;

FIG. 6 is a perspective view showing the shape of a side surface of a recessed portion according to Embodiment 2;

FIG. 10A is a plan view showing a structure of a main part of an electronic parts mount device according to Embodiment 4;

FIG. 10B is a sectional view taken along the line 10B—10B of FIG. 10A;

FIG. 12A is a schematic view for explaining the function of Embodiment 5;

FIGS. 12B and 12C are sectional views, respectively, taken along the lines of 12B—12B and 12C—12C of FIG. 12A;

FIGS. 13A to 13C are schematic views showing cases in which a crystal orientation of a substrate to be bonded is deviated;

FIG. 14A is a plan view showing a structure of a main part of an electronic parts mount device according to Embodiment 6;

FIG. 14B sectional view taken along the line 14B—14B of 14A;

FIG. 15 is a sectional view showing a structure of a main part of an electronic parts mount device according to Embodiment 7;

FIG. 16A is a perspective view and FIGS. 16B and 16C are sectional views showing mounting steps of the electronic parts according to Embodiment 8;

FIG. 17 is a schematic illustration showing a structure of a main part of an electronic parts mounting apparatus used in Embodiment 9;

FIG. 18 is a sectional view showing an insertion state of the electronic part according to Embodiment 9;

FIG. 19 is a sectional view showing an insertion state of an electronic part according to Embodiment 10;

FIG. 20 a plan view showing an insertion state of an electronic part according to Embodiment 11;

FIG. 21 is a plan view showing an insertion state of a small electronic part according to Embodiment 11; and FIG. 22 is a sectional view showing an insertion state of a small electronic part according to Embodiment 12.

DETAILED DESCRIPTION OF THE PREFERRED EMBODIMENTS

The present invention will be described in detail with reference to the accompanying drawings.

In the following embodiments, an electronic part will be mainly represented by a laser element. However, the present invention can be practiced with other electronic parts such as a microlens, an optical fiber, and a passive part of an element. A substrate is not limited to one having a recessed portion, and an Si substrate, a metal substrate, a ceramic substrate, and the like may be selected in accordance with the applications.

Embodiment 1

Figure 1:
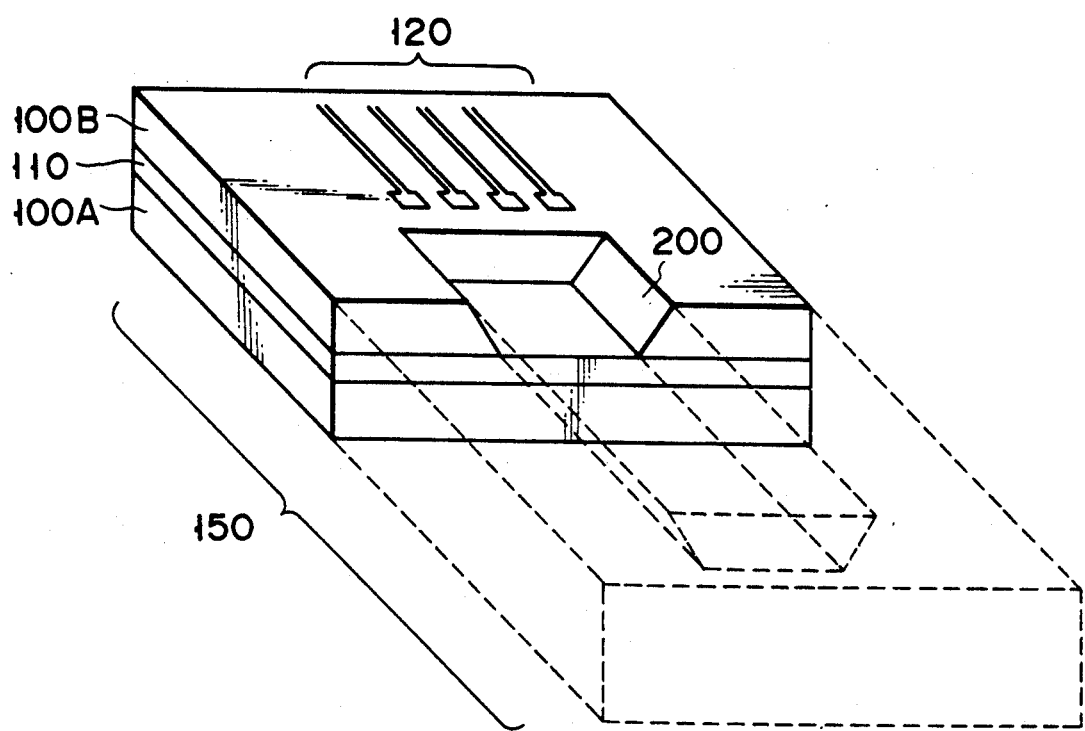
FIG. 1 a perspective view showing a structure of a main part of an electronic parts mount device according to Embodiment 1 of the present invention.

FIG. 1 is a perspective view showing a structure of a main part of an electronic parts mount device according to Embodiment 1 of the present invention.

An electronic parts mount device 150 of FIG. 1 is obtained by bonding substrates 100A and 100B through an oxide film 110. A recessed portion 200 is formed in a central portion of the substrate 100A, and electrode wirings 120 are formed on any other portion of the substrate 100A excluding the recessed portion.

The steps of the method of manufacturing the electronic parts package device 150 shown in FIG. 1 will be described below.

(1) Two silicon substrates 100A and 100B are formed by smooth polishing to have predetermined thicknesses, e.g., the substrate 100A has a thickness of 250 μm and the substrate 100B has a thickness of 200 μm, and are bonded through the oxide film 110 formed by thermal surface oxidation.

(2) The mount body 150 obtained by bonding the substrates 100A and 100B is subjected to normal masking and etching steps to form the recessed portion 200 as the element mounting portion. In these steps, if the edge of the mask is parallel to the silicon crystal orientation, backward etching in the lateral direction occurs very little. Etching in the direction of the depth is automatically stopped by the oxide film 110. Therefore, the size of the recessed portion 200 is automatically determined by the mask precision, and the depth thereof is automatically determined by the substrate thickness precision. As a result, both the size and depth of the recessed portion 200 can be controlled with high precision.

(3) The necessary electrode wirings 120 and the like are formed in one surface of the mount body 150, and the resultant substrate is cut into a predetermined size.

With the above steps, the electronic parts mount device 150 (element mounting substrate) is completed.

FIGS. 2A and 2B, and 3A and 3B show cases in which the electronic parts mount device 150 formed as described above is utilized as a submount of a semiconductor laser module. FIGS. 3A and 3B show a laser array in which four lasers are formed as an array, and a fiber array in which four fibers are formed as an array. The number of lasers or fibers constituting the array can be one or more.

Figure 2A:
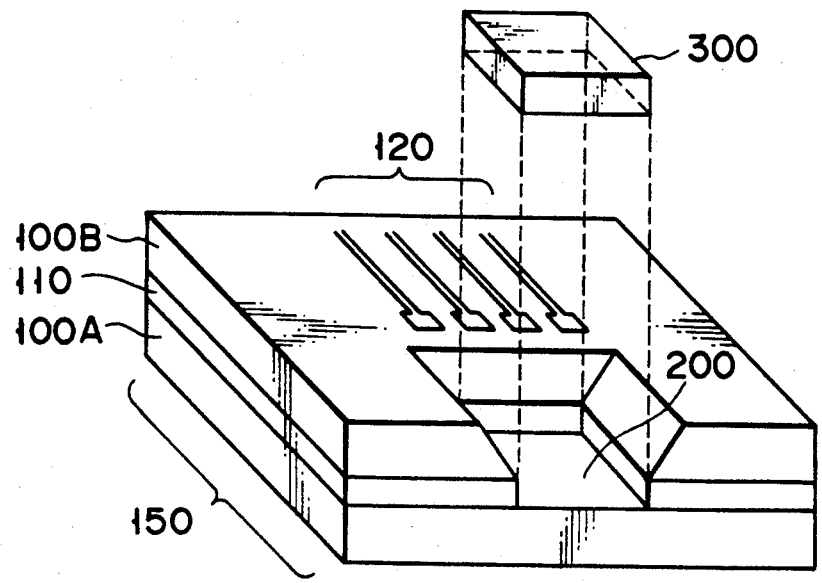
FIGS. 2A and 2B are perspective views showing cases in which the electronic parts mount device of Embodiment 1 is applied to a laser module mount body.
Figure 2B:
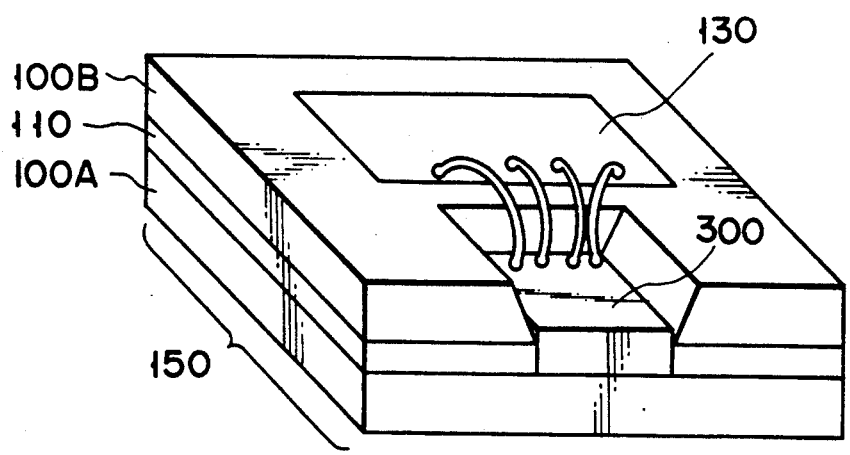

FIGS. 2A and 2B show the steps of mounting a laser element 300 on the electronic parts mount device 150.

(1) Before the mount body 150 is cut out as a part, the oxide film 110 exposed to the bottom surface of the recessed portion 200 is removed by hydrofluoric acid or the like. A solder member (e.g., AuSn) is formed on the bottom surface of the recessed portion 200, and the lower surface of the substrate is metallized (e.g., AuCr).

(2) The mount body 150 is cut out at a predetermined position into a predetermined size (e.g., 3.9 mm×6.0 mm). The laser element 300 polished to have a predetermined thickness (e.g., 100 μm) is mounted on the bottom surface of the recessed portion 200. In this step, if the size of the recessed portion 200 is set to coincide with the size of the laser element 300 and the laser element 300 is mounted such that its edge and the edge of the recessed portion 200 coincide or are parallel to each other, the laser element 300 is accurately arranged.

(3) The laser element 300 is fixed by soldering in the annealing step and the like.

Normally, handling is largely restricted as a laser element itself is very small. For example, 1) the end face of the active layer cannot be held by a pair of tweezers, and 2) the degree of flexibility in electrode wiring is small. However, the electronic parts mount device 150 of this embodiment is of a submount element type in which an element is mounted, the electronic parts mount device 150 is larger than the laser element 300 itself, and necessary electrode wiring is completed. Therefore, flexibility in handling and the degree of flexibility in mount wiring become large.

The silicon substrate 100 is used not only as an alignment tool. Rather, as shown in FIG. 2B, when the IC element 300 and the like are formed in the silicon substrate 100 to provide a hybrid IC, the entire module can be reduced in size, and the electrode wirings can be reduced to a minimum. Therefore, it is advantageous especially in a high-speed operation.

A case in which the submount described above is connected to an optical fiber will be described with reference to FIGS. 3A and 3B. Recently, a ribbon fiber connector, which is a so-called MT connector, is commercially available as a tool for connecting a ribbon fiber in which a plurality of optical fibers are bundled. As shown in FIG. 3A, with an MT connector, two connectors 400 are connected through two pins 440. An end face 450 of a ribbon fiber (not shown) inserted from the rear surface of a connector 400 is arranged with high precision between pin insertion portions on the front surface of the connector 400. When the front surfaces of the two connectors 400 are abutted and the two connectors 400 are combined by a clip 460, the ribbon fiber can be easily connected to the submount.

By utilizing the MT connector shown in FIG. 3A, the positional relationship between the laser element, mounted in the submount previously described, and the optical fiber as another module constituent part can be maintained at a high precision. FIG. 3A shows the structure of the MT connector, and FIG. 3B is a sectional view of a completed assembly taken along the line 3B—3B of FIG. 3A.

The electronic parts mount device is mounted in the MT connector in the following steps.

The electronic parts mount device 150 is cut out to coincide with the gap (e.g., 3.9 mm) between the pins 440 of each MT connector 400, and is mounted to coincide with a front end 430a of a copper base 430, or is mounted and set back from the front end 430a of the copper base 430 while being parallel to it. To perform this mounting, the lower surface of the electronic parts mount device 150 may be metallized by In vapor deposition and heated to about 200° C. under an appropriate pressure. The laser element 300 is arranged at the central portion of the front edge of the electronic parts mount device 150.

The pins 440 of the MT connectors 400 are fitted to sandwich the electronic parts mount device 150, and the pins 440 are pressed by an appropriate cover 410. The cover 410 may press the base 430 by screwing but not by the pins 440. The diameter of a pin 440 is generally 700 μm. If the thickness of the electronic parts mount device 150 is set to 450 μm, the cover 410 can reliably press the pins 440 without contacting the electronic parts mount device 150. If the thickness of the laser element 300 is set to 100 μm and that of the bottom portion of the submount is set to 250 μm, the active layer of the laser element 300 coincides with the height of the central portion of the pins 440, i.e., the central height of the fiber end face 450. As a result, the laser element 300 can be reliably caused to oppose the fiber end face 450.

The force to urge the MT connectors 400 against the base 430 in the horizontal direction can be obtained by utilizing the clip 460. That is, if the length of the cover 410 is equal to that of the MT connectors 400, the clip 460 only need be fitted. If an appropriate step is formed in the rear portion of the base 430, a holder plate 420 is inserted in this step, and the entire assembly is sandwiched by the clip 460 together with the holder plate 420, the MT connectors 400 can be urged more reliably.

The above mechanism will be summarized as follows. The MT connectors 400 are reliably held at accurate positions with respect to the electronic parts mount device 150, in the lateral direction by sandwiching the electronic parts mount device 150 by the pins 440, in the vertical direction by sandwiching the pins 440 by the cover 410 and the base 430, and in the forward-backward direction by sandwiching by the clip 460. Furthermore, the laser electrode element 300 is accurately positioned on the electronic parts mount device 150 as described previously. As a result, the positional relationship between the laser element 300 and the end face 450 of the fiber can be correctly maintained.

Embodiment 2

Embodiment 2 will be described with reference to FIGS. 4 to 6. FIG. 4 is a perspective view showing a substrate and an element which have a structure similar to FIG. 2A. Coordinate axes are added in FIG. 4 for the purpose of descriptive convenience of this embodiment.

In this embodiment, a semiconductor element 300 is aligned by side surfaces of a recessed portion 200, in the same manner as in Embodiment 1. Therefore, the semiconductor element 300 is mounted at an accurate position and in accurate directions in any of the X-, Y-, and Z-axes in a mount body 150. In addition, since Si has a high thermal conductivity and a high electric conductivity, no problem arises in terms of heat dissipation and formation of electrodes. In FIG. 4, the mount body 150 has wirings 120 connected to the semiconductor element 300 through bonding wires or the like, and an inclined surface (side surface tapered portion) 210 of the recessed portion 200.

Figure 5A:
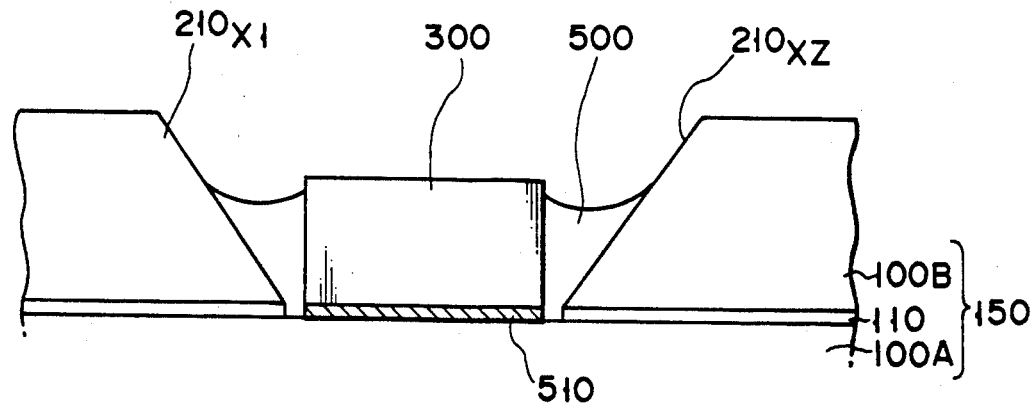

FIG. 5A is a sectional view taken along a direction of the X-axis of FIG. 4 and shows a state in which the semiconductor element 300, e.g., a semiconductor laser, is fitted in the recessed portion 200 of the mount body 150 shown FIG. 4. When a fluid member 500 is inserted to fill the space between the element 300 and side surfaces $210_{X1}$ and $210_{X2}$, the element 300 is held at a correct position between the two side surfaces 210 due to the surface tension of the fluid member 500. In this state, a pressure is applied to the element 300 from the above, and a solder member 510 formed on the lower surface of the element 300 and the bottom surface of the recessed portion 200 are melted by heating to perform bonding. With this method, since the clearances between the element 300 and the side surfaces $210_{X1}$ and $210_{X2}$ can be set large to a certain degree, the element 300 can be easily inserted, and self-alignment of the element 300 is enabled.

Figure 5B:
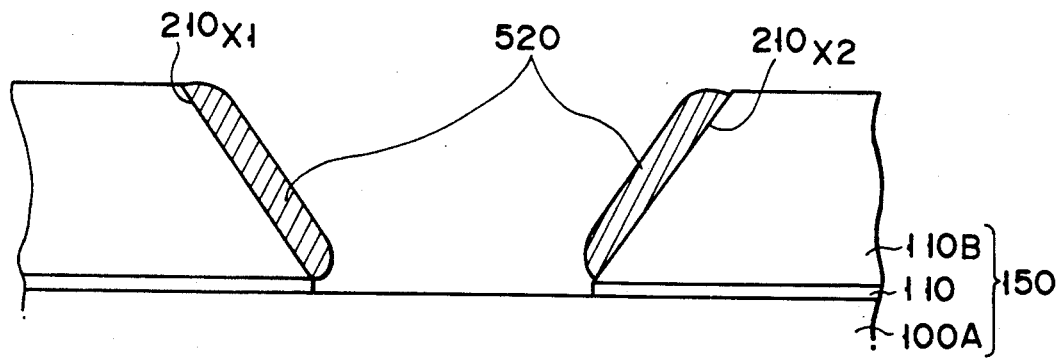

The fluid member 500 to be inserted may be a liquid such as water or alcohol and may be evaporated after alignment. Also, in view of element passivation, it is effective to use a hardening resin or the like as the fluid member 500 to constantly fill the clearances. Furthermore, when a molten low-melting metal or a conductive resin is used, the contact resistance is decreased both electrically and thermally, and thus a more effective result can be obtained. To insert the low-melting metal, it can be melted in a crucible and is filled in the clearances, or can be filled in the clearances by means of shot or powder filling and then melted by heating. Alternatively, as shown in FIG. 5B, a low-melting metal, e.g., In or AuSn, may be deposited on the side surfaces to have a large thickness of 1 to 5 $\mu$m, and after insertion of the element 300, may be melted by heating to flow.

Figure 5C:
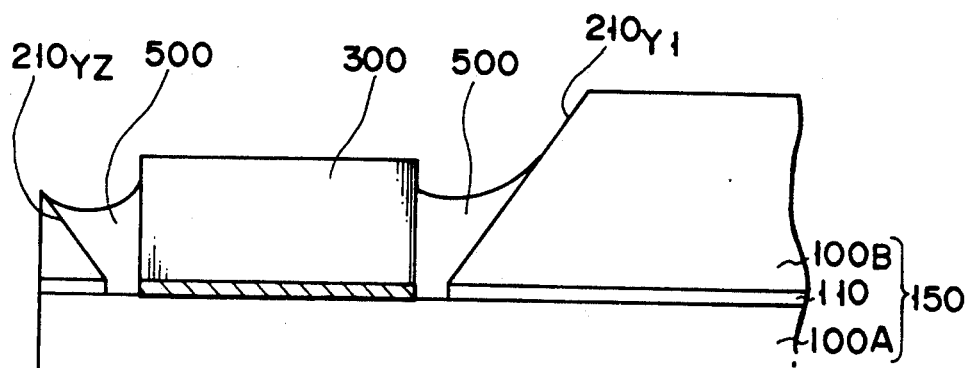

In order to perform alignment in the Y-axis direction, as shown in FIG. 5C, a side surface $210_{Y2}$ facing upward may be provided to oppose a side surface $210_{Y1}$. However, as shown in FIG. 5D, a notched side surface $210_Z$ may be formed under the element 300. In the case of FIG. 5D, the fluid can be inserted most easily by the following manner. That is, as shown in FIG. 6, a plurality of grooves 250 may be formed in the bottom surface of the recessed portion 200 of the mount body 150, and the fluid may be filled from the side of the side surface $210_Z$ through an aligning plate 470. In this case, it is possible to form a groove in the aligning plate 470 so that the excessive fluid is discharged through this groove.

According to this embodiment, since the member 500 inserted between the semiconductor element 300 and the side surface 210 of the recessed portion 200 has a predetermined surface tension, it draws the semiconductor element 300 to the side surface 210. Therefore, if the side surface 210 is formed at a predetermined position, the semiconductor element 300 is self-aligned with respect to the side surface 210.

Embodiment 3

Figure 7:
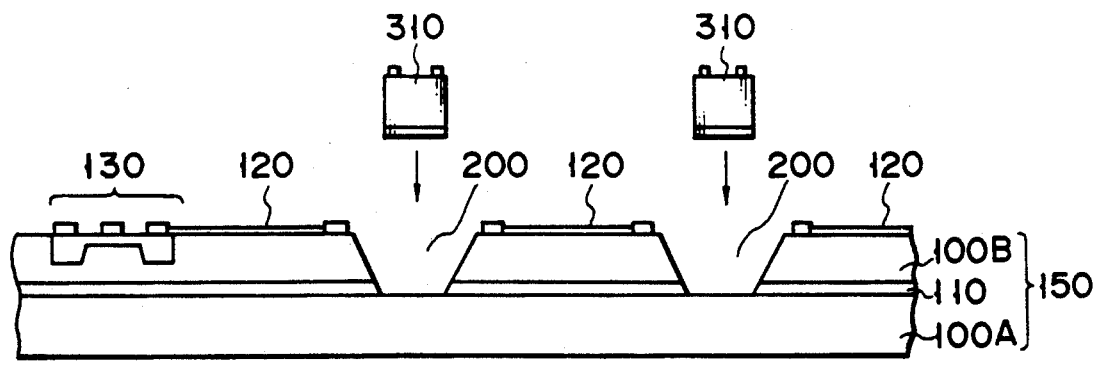
FIG. 7 is a sectional view showing a structure of a main part of an electronic parts mount device according to Embodiment 3.
Figure 8:
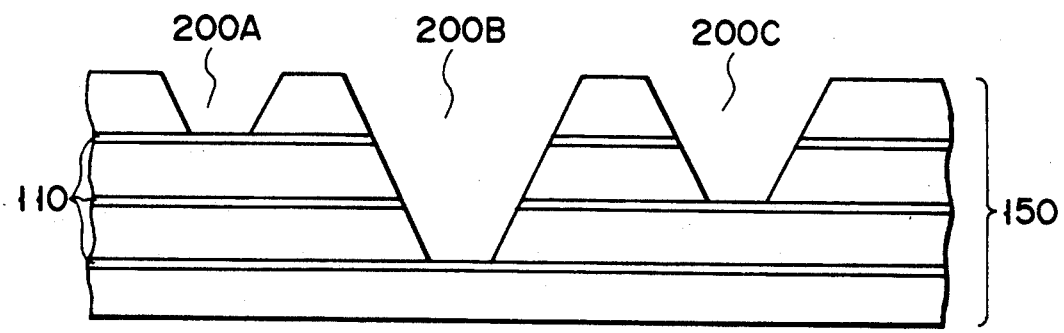
FIG. 8 is a sectional view showing the first modification of the electronic parts mount device shown in FIG. 7.
Figure 9:
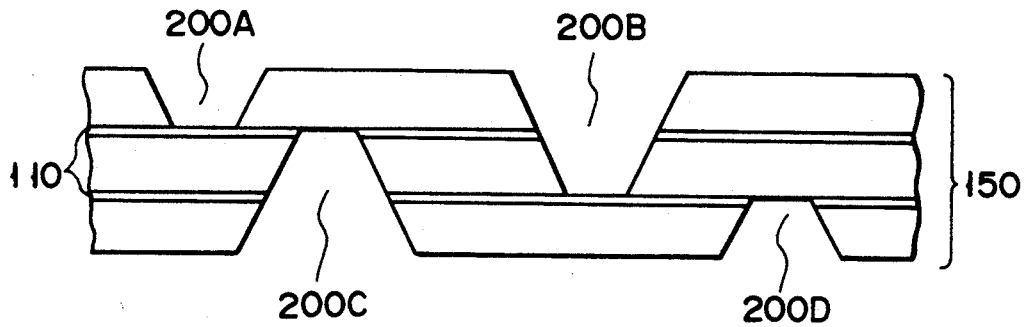
FIG. 9 is a sectional view showing the second modification of the electronic parts mount device shown in FIG. 7.

FIGS. 7 to 9 are sectional views respectively showing structures of main parts of electronic parts mount devices according to Embodiment 3. The same reference numerals in FIGS. 7 to 9 denote the same or corresponding members as in FIGS. 2A and 2B.

The electronic parts mount device of FIG. 7 is different from that of Embodiment 1 in that a plurality of recessed portions 200 are formed. In this embodiment, electronic elements 310 such as FETs can be mounted on a substrate 100 similarly to Embodiment 1.

An oxide film 110 serves as an electrical insulating film between a substrate 100A and the electronic elements 310 when it is left, and can be utilized as part of wirings to ground and the like when it is removed.

Electrical connection on the upper surface of each element can be performed by wire bonding or by TAB connection. In this embodiment, TAB connection is more preferable. It is because since each electronic element is mounted at a precise position in a mount body 150 and thus collective connection is possible, the process can be simplified with TAB connection. In this case, it is preferable that the height of each electronic element 310 and the depth of the corresponding recessed portion 200 coincide with each other. Then, the effect of the present invention that accurate control of the depth of the recessed portion is facilitated can be sufficiently utilized.

When the heights of the plurality of elements to be mounted differ from each other, as shown in FIG. 8, it is possible to stack a plurality of silicon substrates and to form recessed portions 200A, 200B, and 200C having different depths. As shown in FIG. 9, when recessed portions 200A, 200B, 200C, and 200D are formed on two surfaces of the mount body 150, elements can be firmly mounted with a simple procedure. Therefore, this is more effective in high-density element mounting.

In Embodiments 1 to 3, positioning of a semiconductor element and the like is performed in the bottom portion of the recessed portion 200. It is preferable that the bottom portion of the recessed portion 200 and a contact portion for positioning are at different levels to form a step of a certain degree. Following Embodiments 4 to 7 exemplify a positioning mechanism in which a recessed portion has a double step and a bottom portion and a positioning contact portion of the recessed portion 200 form a step of a certain degree.

Embodiment 4

FIGS. 10A and 10B are views showing a structure of a main part of an electronic parts mount device according to Embodiment 4 in which FIG. 10A is a plan view thereof, and FIG. 10B is a sectional view taken along the line 10B—10B of FIG. 10A. In this embodiment, a positioning recessed portion has a double step, and only a peripheral portion of the recessed portion of Embodiments 1 to 3 is shown.

In this embodiment, silicon substrates 100A, 100B, and 100C are bonded to each other through SiO$_2$ films 110A and 100B. An Si$_3$N$_4$ film 115 is deposited on the lower surface of the uppermost silicon substrate 100C. Regarding the thicknesses of the respective members, in the case of Embodiment 1, those of the silicon substrates 100A, 100B, and 100C may be set to 250 $\mu$m, 10 $\mu$m, and 190 $\mu$m, respectively, those of the SiO$_2$ films 110A and 110B may be set to 1 $\mu$m, and that of the Si$_3$N$_4$ film 115 may be set to 0.2 $\mu$m. The respective substrates can be formed by combining the steps of thermal oxidation, direct bonding, polishing, CVD, and the like.

Thereafter, the uppermost silicon substrate 100C is etched by normal photolithography in the same manner as in the embodiments described above. The crystal orientation of the silicon is formed such that the silicon substrates 100A, 100B, and 100C are bonded respectively with {1 0 0} planes and the mask pattern has <0

1 1> and <0 1 −1> directions. As the etching, anisotropic chemical etching using a KOH aqueous solution or the like may be performed. The $Si_3N_4$ film 115 exposed by etching is removed by ion milling, dry etching, or the like. Subsequently, the $SiO_2$ film 110B sandwiched between the $Si_3N_4$ film 115 and the silicon substrate 100B is etched by selective side etching of, e.g., 10 μm by using an aqueous solution of ammonium fluoride or the like.

Then, silicon anisotropic chemical etching is performed again to form a recessed portion having a double step, as shown in FIG. 10B, and positioning of the semiconductor element 310 can be effectively performed. In this embodiment, the pattern for the silicon substrate 100C and that for the silicon substrate 100B can be formed by self-alignment. Therefore, no pattern offset occurs between the two substrates 100B and 100C, and a problem due to double step does not occur.

Embodiment 5

Figure 11A:
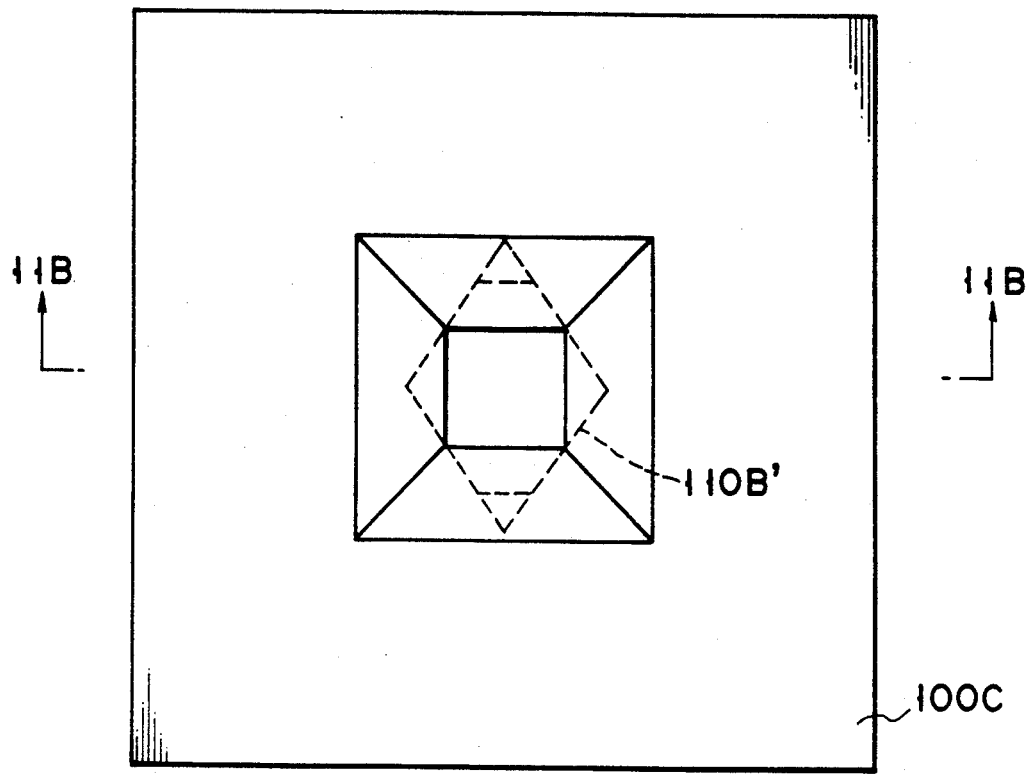
FIG. 11A is a plan view showing a structure of a main part of an electronic parts mount device according to Embodiment 5.
Figure 11B:
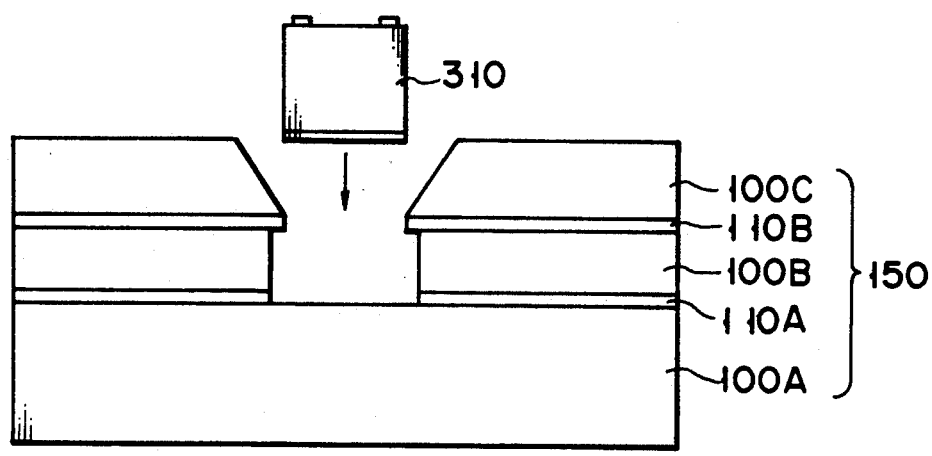
FIG. 11B is a sectional view taken along the line 11B—11B of FIG. 11A.

The double step shown in FIGS. 10A and 10B can be formed not only by side etching but also by utilizing the crystal anisotropy of silicon. FIGS. 11A and 11B show Embodiment 5 of the present invention, in which FIG. 11A is a plan view thereof, and FIG. 11B is a sectional view taken along the line 11B—11B of FIG. 11A. In this embodiment, when silicon substrates 100A, 100B, and 100C are bonded through only $SiO_2$ films 110A and 110B, the silicon substrates 100B and 100C are directly bonded by changing the crystal planes or crystal orientations. More particularly, the silicon substrate 100B on the silicon substrate 100A (having an arbitrary crystal orientation) is bonded with a {1 1 0} plane, and the silicon substrate 100C is bonded with a {1 0 0} plane. Also, a <0 0 1> direction of the silicon substrate 100B is aligned with a <0 1 1> direction of the silicon substrate 100C.

A mask pattern having <0 1 1> and <0 1 −1> directions is formed on the surface of the silicon substrate 100C of the mount body 150, and anisotropic chemical etching of silicon is performed in the same manner as in the case of FIGS. 10A and 10B. Subsequently, the exposed portion of the $SiO_2$ film 110B is removed by etching, and anisotropic chemical etching of silicon is performed again. As a result, each silicon crystal exhibits a geometric {1 1 1} crystal plane matching the shape of the mask. Especially, an intermediate portion 110B' of the silicon substrate 100B is etched to form a rhombus or parallelogram inscribing the mask pattern. The pattern of a rhombus or parallelogram can be formed such that most of its side surface forms a vertical surface by appropriately setting the thickness of the silicon substrate 100B.

The reason for this will be described with reference to FIGS. 12A to 12C. FIG. 12A shows only a square pattern (solid line) serving as a mask and an etching pattern (broken line), FIG. 12B is a sectional view taken along the line 12B—12B of FIG. 12A, and FIG. 12C is a sectional view taken along the line 12C—12C of FIG. 12A. FIGS. 12A to 12C show an opening for positioning, i.e., a positioning pattern 220 of a semiconductor element or the like, a region 210A to which the $SiO_2$ film 110A on the bottom portion is exposed in an etched region (having a vertical surface on the boundary side surface) of the silicon substrate 100B, and a region 210B to which the $SiO_2$ film 110A on the bottom portion is not exposed.

The region 210B has an inclined surface, as shown in FIG. 12B, and this inclined surface is a {1 1 1} (equivalent to a (1 1 1) plane) plane which is the same as the vertical surface of the boundary of the rhombus. Although the inclined surface 210B can be further extended if the silicon substrate 110B is sufficiently thick, it is stopped in FIG. 12B at an indicated position since the extending amount (depth) is defined by the $SiO_2$ film 110A. If the region 210B is extended to the opening 220, the initial object cannot be achieved as the bottom surface of the opening does not become flat. Therefore, these portions must be designed by considering the dimensional relationship among the size of the opening 220, the thickness of the silicon substrate 100B, and the size of the inclined surface 210B.

A design example will be described. For the sake of simplicity, the opening 220 serving as the mask is a square having a side with a length a, and the vertical diagonal of the rhombus of FIG. 12A is in the <0 0 1> direction of the silicon substrate 100B. The thickness of the silicon substrate 100B is defined as D, and b, c, and d are defined as shown in FIG. 12A. In this case, a and D are used as parameters to obtain other values. That is, $b=a/2^{\frac{1}{2}}$, $c=a/2^{3/2}$, and $d=D\times 2^{\frac{1}{2}}$, and only $D<a/2$ need be satisfied to have d to be smaller than b ($d<b$).

Accordingly, in the case of FIGS. 12A, 12B, and 12C, no problem occurs if only the thickness of the silicon substrate 100B is set to be ½ or less of the mask width of the silicon substrate 100B in the <0 0 1> direction. Generally, when the direction of the opening serving as the mask is deviated from the <0 0 1> direction of the silicon substrate 100B (when the crystal orientations of the silicon substrates 100B and 100C in bonding are deviated from each other), cases shown in FIGS. 13A, 13B, and 13C apply. Even in these cases, the thickness of the silicon substrate 100B can be defined in the same manner as described above. For example, in FIGS. 13B and 13C, if the opening of the mask is a square having a side a, no problem occurs as far as the thickness D is 20% or less of a.

Embodiment 6

An opening having a double step can be formed by a mount body 150 using another crystal plane as well, in the same manner as in the embodiment shown in FIGS. 11A and 11B. FIGS. 14A and 14B show Embodiment 6, in which FIG. 14A is a plan view thereof, and FIG. 14B is a sectional view taken along the line 14B—14B of FIG. 14A. In this embodiment, silicon substrates 100A, 100B, and 100C are bonded through only $SiO_2$ films 110A and 110B, in the same manner as in FIGS. 11A and 11B. Bonding is performed such that both the silicon substrates 100B and 100C on the single substrate 100A (having an arbitrary crystal orientation) are set to have (1 0 0) planes and the <0 1 1> direction of the silicon substrate 100B and the <0 1 1> direction of the silicon substrate 100C are deviated from each other, e.g., by 45°. Using the mount body 150, a mask pattern extending in the <0 1 1> and <0 1 −1> directions is formed on the surface of the silicon substrate 100C, in the same manner as in the case of FIGS. 11A and 11B. Anisotropic chemical etching of silicon is performed, and the exposed $SiO_2$ film 110B is removed by etching. Subsequently, anisotropic chemical etching of silicon is performed again.

As a result, both the silicon substrates 100B and 100C have a geometric {1 1 1} crystal plane matching the shape of the mask. Especially, an intermediate portion 100B' of the silicon substrate 100B is etched to form a square or rectangle inscribed by a pattern serving as a mask. The square or rectangular pattern has a side surface of a {1 1 1} plane, and its corner portions do not form a flat bottom surface with respect to the square or rectangular mask opening. Even so, this irregular mask can be used to achieve the object, and further can also be applied as a holder of a lens 350 as shown in FIG. 14B.

Embodiment 7

The double step as shown in FIGS. 14A and 14B can be applied to a surface input/output type electronic parts mount device. FIG. 15 shows Embodiment 7. Silicon substrates 100B and 100C are bonded through an SiO$_2$ film 110B. Bonding is performed such that both the silicon substrates 100B and 100C have a {1 0 0} plane and the <0 1 1> direction of the silicon substrate 100B and the <0 1 1> direction of the silicon substrate 100C are deviated from each other, e.g., by 45°. A protection mask such as SiO$_2$ is formed on the lower surface of the silicon substrate 100B. Using the mount body 150, a mask pattern extending in the <0 1 1> and <0 1 −1> directions is formed on the upper surface of the silicon substrate 100C, in the same manner as in the case of FIGS. 11A and 11B. Anisotropic chemical etching of silicon is performed, the exposed SiO$_2$ film is removed by etching, and subsequently, anisotropic etching of silicon is performed again.

As a result, both the silicon substrates 100B and 100C have a geometric {1 1 1} crystal plane matching the shape of the mask. Especially, the intermediate portion 100B' of the silicon substrate 100B is etched to form a square or rectangle inscribed by a pattern serving as a mask. Thereafter, the protection mask on the lower surface of the silicon substrate 100B is removed, and the surface input/output type semiconductor element (e.g., a semiconductor laser, a light-emitting diode, or a photodiode) 310 and the lens 350 are mounted and electrically connected.

Embodiment 8

Embodiments 1 to 7 exemplify positioning by using the recessed portion of the substrate. Positioning can also be performed without forming a recessed portion in the substrate but through a metal bump.

FIGS. 16A, 16B, and 16C show a process for explaining the method of Embodiment of the present invention.

(1) As shown in FIG. 16A, a solder member 510 is formed on a lower electrode 540 of an element 300 by using a pattern, and bumps 530 are formed in part of the region of the solder member 510. Same patterning and bump formation are performed for a substrate 100.

(2) As shown in FIG. 16B, the opposing bumps 530 are bonded to each other, and the element 300 is heated in a free state. In this step, the element 300 is automatically moved by the metal centering effect to a position to which it should be connected.

(3) When a pressure is applied to the element 300 from the above, the bumps 530 are crushed and the opposing solder members 510 are fused with each other, as shown in FIG. 16C, and the element 300 is bonded with the substrate 100. In this process, since substantially the entire lower surface of the element 300 is bonded in tight contact with the substrate 100, thermal and electrical resistances are reduced.

It is also possible to cause the crushed bumps 530 to spread on the entire lower surface of the element 300, so that the bumps 530 also serve as the solder members. An insulating film can be formed on the bumps or the solder member to obtain electrical insulation, depending on the case. The positions of the bumps 530 are not limited to the four corners of the element 300. The bumps can be formed on the electrode of the upper surface of the element 300, but not on the electrode on the lower surface of the element 300, and flip chip connection can be performed in a face-down state. By this embodiment, the opposing electrodes are automatically aligned. Therefore, a small electrode pattern, that cannot be achieved by conventional flip chip connection, can be formed on the surface of the element.

The method of this embodiment can be applied not only to a flat substrate but also to a bottom surface having a hole as described in FIG. 4, and can also be combined with the method of Embodiment 2. In the method of Embodiment 2 as well, the number of side surfaces to be positioned can be one depending on the case, and the side surfaces need not intersect at a right angle. In the method of Embodiment 8, when the semiconductor element is bonded through the metal bumps and then heated, the element is automatically positioned with respect to the substrate by the metal bump centering effect described previously. By any method, the element is bonded in tight contact with the flat surface. Therefore, heat generated by the element is easily dissipated.

Embodiments 1 to 8 utilize the metal centering effect. Following Embodiments 9 to 12 show a method for correctly positioning an electronic part by utilizing a small vibration.

Embodiment 9

FIG. 17 is a schematic view showing an apparatus for mounting electronic parts according to Embodiment 9 of the present invention. In this embodiment, a small vibration is given from a side portion of a substrate. The small vibration can be given not only from the side surface but also from other surfaces such as an upper or lower surface. Referring to FIG. 17, a recessed portion 200 is formed in an upper surface of a substrate 100 comprising an Si substrate by dry etching. A movable support member 600 supports a semiconductor element 300 (electronic part to be mounted in the recessed portion 200 and moves toward the substrate 100. The movable support member 600 can be obtained by, e.g., mounting a vacuum chuck capillary on a movable mechanism.

A heater (not shown) is mounted in a support base 610 for placing the substrate 100, in order to heat the substrate 100. A support section 620 for supporting the substrate 100 in the lateral direction has a press mechanism using, e.g., a spring. A small vibration generator 630 gives a small vibration to the substrate 100 through the support section 620. The small vibration generator 630 is constituted by a vibrator comprising an electromagnet and an iron piece, or a electroacoustic converter, e.g., a piezoelectric transducer or a ferrite vibrating element. The apparatus of this embodiment further comprises an AC generator 640 for driving the small vibration generator 630, and a stationary wall 650.

Only a schematic structure of the apparatus of this embodiment has been described. However it is naturally possible to add a monitor system, a heat power supply system, a capillary pressure adjusting system, an ambient gas introducing system, and the like to this apparatus, in addition to the elements shown in FIG. 17. These control systems and their automated units can be mounted in the apparatus.

Assembly steps using the above mounting apparatus will be described.

(1) The substrate 100 is mounted on the support base 610 and supported by the support section 620. In this case, the substrate 100 can be supported not only by the method shown in FIG. 17 but also by upward pressing, vacuum chucking from the lower surface, or a combination of them.

(2) The electronic part 300 is transferred to the recessed portion 200 in the substrate 100 by the movable support member 600.

(3) The AC generator 640 is operated to give a small vibration to the substrate 100 so that the electronic part 300 is inserted in the substrate 100. In this case, two different methods are available. That is, according to the first method, the electronic part 300 is inserted while being chucked (supported) by the movable support mechanism 600. According to the second method, the electronic part 300 is preliminarily placed in or in the vicinity of the recessed portion 200 and chucking (supporting) by the movable support member 600 is released.

In the first method, time required for insertion is short, and a probability of insertion failure is low. However, since the electronic part 300 such as a semiconductor element tends to be easily broken, when a small vibration is given to it, its end portion or its contacting portion with the movable support member 600 can be damaged. In the second method, although the electronic part 300 is not inserted in the recessed portion 200 but slidably moves on the substrate 100 in a rare case, it is not likely to be damaged. These methods may be selected in accordance with the types and natures of the electronic parts to be mounted.

After the electronic part 300 is inserted in the above manner, the AC generator 640 is stopped, or the AC generator 640 is kept operating depending on the case, and a pressure is applied to the electronic part 300 by the movable support member 600 or by a separate pressure applying mechanism. The solder member is melted by the heater of the support base 610 and then is cooled and solidified to fix the electronic part 300. The electronic part 300 can be fixed by any other method than soldering. For example, a thermosetting resin or ultraviolet-curing resin may be used and thermal hardening or ultraviolet-light curing may be caused.

A practical example of the steps of mounting and assembling of this embodiment will be described with reference to FIG. 18. FIG. 18 is a sectional view and shows a state in which a semiconductor element 300 is inserted by using the apparatus and method shown in FIG. 17. In FIG. 18, a semiconductor element (e.g., a semiconductor laser element) is inserted in a holder portion of an Si substrate. A substrate 100 is an n-type low-resistance Si substrate. A multilayer film mask of $SiO_2$ and $Si_3N_4$ is formed on the Si substrate 100. Dry etching (about 50 μm) using a $CF_4+O_2$ gas is performed to form a recessed portion 200 (holder portion). The mask size was determined so that the recessed portion 200 had a size of 305 μm×405 μm at its semiconductor element inserting portion. A GaInAsP/InP type semiconductor laser element was employed and cut out by a scriber to form the semiconductor element 300 having a thickness of about 100 μm and a size of 300 μm×400 μm, while leaving clearances with respect to the recessed portion 200 of about 5 μm each.

Multilayer vapor deposition was performed to deposit Au, Sn, and Au (Sn was about 20%) in the recessed portion 200 of the substrate 100 to a thickness of about 2 μm in accordance with the lift-off method. The formed multilayer was a solder member 510 for fixing the semiconductor element. The semiconductor element 300 was placed upside up on the substrate 100 fabricated in this manner Most part of the semiconductor element 300 was incompletely inserted, as indicated by a broken line 300' in FIG. 18. Thereafter, a small vibration is applied to the substrate 100 while chucking of the semiconductor element 300 was released. Then, most part of the semiconductor element 300 was correctly inserted, as indicated by a solid line in FIG. 18. The small vibration applied in this case has a frequency of 50 Hz and an amplitude of about 2 μm.

The insertion state was not largely changed even when the frequency of vibration was changed, and a correct insertion state was obtained at substantially any frequency. It was found that an incomplete insertion was due to an incomplete shape of the semiconductor element 300 obtained by cutting.

The small vibration can be of a high-frequency range. Especially, if a so-called ultrasonic vibration of 20 kHz or more is employed, it is above a human audible level. Therefore, a machine noise trouble caused by a small mechanical vibration, i.e., audible discomfort to a person operating the apparatus is substantially prevented, and a silencer or noise control equipment is not needed at a site where the apparatus is installed. If the amplitude of the small vibration is 10 μm or less, adverse effects to the person operating the apparatus and a surrounding apparatus can be suppressed. As a small vibration in the ultrasonic range, e.g., a vibration having a frequency of 60 kHz and an amplitude of about 1 μm was applied. In this case, the obtained insertion state was as good as that described previously. The direction of vibration, the vibration propagation state, the vibration waveform, and the like of these small vibrations can be arbitrarily set, and may be appropriately selected in accordance with the frequency of vibration, amplitude, or variations in them over time, as well as the material and the shape of the substrate and the electronic part employed.

Thereafter, the resultant structure was heated to about 350° C. in a nitrogen atmosphere containing a 20% hydrogen while pressing the element with a load of about 10g, thereby fixing the semiconductor element by the solder member 510. After fixing, the alignment state of the semiconductor element was as follows. That is, excluding a defective element having a smaller size due to inappropriate cutting, the center of the semiconductor element was aligned with the center of the holder portion of the substrate in any direction with an error of about ±2 μm. According to the result of the proper test of the packaged semiconductor laser element, characteristics as good as those before mounting were obtained.

According to this embodiment, the electronic part 300 is transferred to the recessed portion 200 in the substrate 100, and a small vibration is applied to the substrate 100 by the small vibration generator 630. Therefore, the electronic part 300 can be correctly arranged in the recessed portion 200, as indicated by the solid line in FIG. 18, without causing an inclination error as indicated by the broken line in FIG. 18. As a result, the clearance in the recessed portion can be reduced in size, and the alignment precision can be improved, thus improving the productivity.

Embodiment 10

FIG. 19 is a view for explaining Embodiment 10 of the present invention. FIG. 19 is a sectional view showing a recessed portion 200, for receiving a semiconductor element 300, formed in a tapered manner. This embodiment is advantageous in the following respects. That is, since the opening of the recessed portion 200 is widened, preliminary mounting of the semiconductor element 300 is facilitated. Also, since the recessed portion 200 has a tapered shape, movement of the semiconductor element 300 to the bottom portion of the recessed portion 200 by application of a small vibration is facilitated. Since a clearance becomes narrow only at the bottom portion of the recessed portion 200, when a solder is melted by heating, upward warp of the solder to the side surface of the semiconductor element due to the capillary of the solder member can be prevented.

A substrate 100 of this embodiment will be described in detail. The substrate 100 comprises Si substrates 100A and 100B, and an $SiO_2$ film 110. This structure is needed because of the following reason. In formation of a taper-shaped recessed portion, the size (processing precision) of the bottom portion of the recessed portion is determined by the precision of the processing depth. Therefore, to form a recessed portion having a deep clearance, the processing depth need be precisely controlled.

In order to fabricate an Si mount body having an $SiO_2$ film at its intermediate portion, as shown in FIG. 19, a so-called direct bonding method can be used. More specifically, the two Si substrates 100A and 100B subjected to mirror surface polishing and cleaning are brought into contact with each other and are heated at a high temperature to perform direct bonding at an atomic level. With this method, a substrate including the substrate 100A of a thickness of 250 $\mu$m, the $SiO_2$ film 110 of a thickness of 2 $\mu$m, and the substrate 100B of a thickness of 200 $\mu$m is formed. Regarding the crystal plane, the Si substrate surface is set to have a (1 0 0) plane, the recessed portion 200 is set to be aligned with the <0 1 1> and <0 1 1> directions, and an $SiO_2$ mask (window) having a size of 595 $\mu$m×695 $\mu$m is formed. Thereafter, chemical etching is performed using an aqueous solution of KOH of a temperature of 80° to 90° C. to expose the $SiO_2$ film 110. Subsequently, the $SiO_2$ film 110 is chemically etched using a solution of ammonium fluoride. In this manner, the substrate 100 with the recessed portion 200 of the bottom portion size of 305 $\mu$m×405 $\mu$m and a tapered angle of about 54° can be formed.

In the substrate 100 of FIG. 19, the $SiO_2$ film 110 as the intermediate layer can be selectively stepped back, i.e., selectively etched. If the $SiO_2$ film 110 is appropriately overreached, it can be utilized as a solder amount adjusting mechanism for absorbing an excessive solder.

Embodiment 11

The above embodiment was described with reference to the two-dimensional sectional view. An embodiment for more effectively using the present invention will be described. FIG. 20 is a view for describing Embodiment 11 of the present invention, and is a plan view showing a recessed portion in which a semiconductor element is to be inserted. This embodiment is an improved embodiment for the purpose of mounting of a semiconductor element and the like.

Generally, an electronic part 300, e.g., a semiconductor element, is obtained by cutting in accordance with a method of, e.g., scribing or dicing described previously. In this case, an intermediate surface portion obtained during cutting is formed comparatively smooth. However, a so-called burr or local deformation can be formed at a boundary during cutting, e.g., a corner of the semiconductor element 300. Such deformation often becomes an obstacle as defective shape when a high alignment precision of several $\mu$m is required.

In the embodiment of FIG. 20, in view of this problem, narrow portions of the clearance are formed to avoid the corners of the semiconductor element 300. That is, portions of the recessed portion 200 corresponding to the four corners of the semiconductor element 300 are formed to spread outwardly, so that defective insertion or defective alignment of the semiconductor element 300 is suppressed. The above problem can also be effectively avoided by forming narrow portions of the clearance in the form of a plurality of point contacts, as shown in FIG. 21.

In insertion of an electronic part by means of application of a small vibration according to the present invention, the clearance of the holder portion of the substrate opposing the electronic part to be mounted is significant, and when the clearance is large, the alignment precision tends to be easily degraded. Especially, since a small electronic part can be easily moved by a small vibration, if the clearance is large, the small electronic part can often be fixed at a biased position. This is the reason why the degradation in precision occurs. Therefore, in the cases of Embodiments 9 to 11, it is preferable that the clearance between the electronic part and the recessed portion of the substrate is 10 $\mu$m or less. With the clearance of this size, an alignment error becomes ±5 $\mu$m or less. Then, the present invention can be applied to alignment between a single mode optical fiber and a light-emitting element.

Embodiment 12

FIG. 22 is a view for describing Embodiment 12 of the present invention, and is a sectional view of a recessed portion, for receiving a semiconductor element, formed in a tapered manner. In this embodiment, when a difference between the thermal expansion coefficients of a substrate and an electronic part is large, a positioning jig is auxiliarily used for inserting the electronic part. The self-alignment effect is enhanced without greatly reducing the clearance used for alignment. In this embodiment, the clearance can be set sufficiently large. Therefore, even when a metal substrate and a glass lens are to be assembled, temperature dependency (e.g., a change in characteristic due to a variation in optical axis) caused by contact between the electronic part and the substrate can be suppressed.

A positioning jig 700 shown in FIG. 22 is formed of silicon by, e.g., etching, and its size and shape are determined such that it contacts the inner surface of a recessed portion 200 of a mount body 150 and the outer surface of an electronic part 300. In assembly, the electronic part 300 is preliminarily mounted. Then, the positioning jig 700 is placed on the electronic part 300, and a small vibration is applied to the small electronic part 300 through the jig 700, thereby achieving predetermined positioning. If a chuck hole 710 for vacuum chucking is formed in the positioning jig 700, both the positioning jig 700 and the electronic part 300 can be supported and moved at once.

In the embodiment of FIG. 22, an intermediate insertion of the positioning jig 700 is needed. Therefore, the clearance is preferably designed to be large considering the machining limit and strength of the positioning jig 700. Hence, the clearance need to be 10 $\mu$m or larger.

The present invention is not limited to the embodiments described above. For example, the substrates bonded to provide the mount body 150 are not limited to a combination of silicon substrates, but various combinations, e.g., silicon and Ge, silicon and GaAs, silicon and InP, silicon and InSb, and the like are possible. The substrate to be bonded is not limited to a semiconductor material, but a dielectric substrate can also be used. For example, $Al_2O_3$, AlN, C-Bn, a ceramic material such as SiC, or a polymer material such as a polyimide can be used. Furthermore, when different types of substrates are bonded, or even when substrates of the same type are bonded, if a denatured layer having a different crystal orientation is formed between them, etching can be automatically stopped by the bonding surface without forming an oxide layer between them. A part to be mounted in the recessed portion is not limited to an optical element or an electronic element, but a fiber, a pin, or a screw can be fitted in the recessed portion and positioned.

Furthermore, a semiconductor element to be mounted in the recessed portion is not limited to a semiconductor laser element, but various types of other semiconductor elements that need precise mechanical alignment can be mounted according to the present invention. The part to be mounted is not limited to a semiconductor element, but various types of other electronic parts such as an optical element can be mounted according to the present invention. In Embodiments 9 to 12, a small vibration is applied to the substrate. However, a small vibration can be applied only to the electronic part, or to both of them. Various changes and modifications may be made without departing from the spirit and scope of the present invention.

As has been described above in detail, according to the present invention, a recessed portion is formed in a mount body, obtained by directly bonding a plurality of substrates, to reach a substrate bonding portion, and a semiconductor element is mounted in the recessed portion. Therefore, a positional relationship between the semiconductor element and other module constituent parts can be correctly held, and the semiconductor element can be mechanically firmly supported.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. An electronic parts mount device comprising:
   a mount body which is obtained by bonding at least two substrates each having a predetermined thickness and a smooth surface, wherein one of said substrates has at least one bonding portion, said mount body having at least one recessed portion selectively formed in one exposed surface of said mount body to a depth which reaches said bonding portion; and
   an electronic part mounted in said recessed portion.

2. An electronic parts mounting device according to claim 1, further comprising a member filled between a side surface of said recessed portion and said electronic part and having a surface tension.

3. An electronic parts mounting device according to claim 1, wherein said mount body is constituted by sequentially stacking and bonding at least three substrates and has a plurality of bonding portions, said substrates having different thicknesses.

4. An electronic parts mounting device according to claim 3, wherein said mount body has a plurality of recessed portions selectively formed in said substrates and having different depths to selectively reach said bonding portions.

5. An electronic parts mounting device according to claim 4, further comprising at least one recessed portion selectively formed in a substrate opposing to another exposed surface of said mount body.

6. An electronic parts mounting device according to claim 1, wherein said mount body has a first recessed portion formed to extend from said exposed surface to said bonding portion of said mount body, and a second recessed portion formed at a position corresponding to said first recessed portion and extending from said bonding portion to another exposed surface of said mount body.

7. An electronic parts mounting device according to claim 6, wherein the width of said first recessed portion is wider than the width of said second recessed portion.

8. An electronic parts mounting device according to claim 7, wherein said electronic part is supported by a side surface of said first recessed portion.

9. An electronic parts mounting device comprising:
   a mount body (150) constituted by at least three substrates having predetermined thicknesses and bonded by stacking;
   said mount body having first and second bonding portions, first and second exposed surfaces, and at least one recessed portion selectively formed to extend from said first exposed surface and reach said second bonding portion through said first bonding portion, and the width of said first recessed portion being wider than the width of said second recessed portion; and
   an electronic part mounted in said recessed portion.

10. An electronic parts mounting device according to claim 9, wherein said electronic part is supported by a side surface of said recessed portion between said first bonding portion and said first exposed surface.

11. An electronic parts mounting device according to claim 9, wherein said first bonding portion of said first recessed portion has an area smaller than that of said first bonding portion of said second recessed portion.

12. An apparatus for mounting electronic parts comprising:
    a substrate having a recessed portion for mounting an electronic part therein, the electronic part being machined to have a predetermined shape;
    holding means for holding said substrate;
    moving means for holding the electronic part and moving the electronic part to said recessed portion of said substrate; and
    vibration generating means for applying a small vibration to at least one of said substrate and the electronic part.

13. An apparatus for mounting electronic parts according to claim 12, wherein said vibration generating means includes one of an electromagnetic vibrating element and a piezoelectric vibrating element for converting an electrical vibration to a mechanical vibration.

14. An apparatus for mounting electronic parts according to claim 12, wherein said vibration generating means includes means for applying an ultrasonic vibration to one of said substrate and the electronic part.

15. An electronic parts mount device comprising:

a mount body which is obtained by bonding together at least first and second substrates through an intermediate bonding layer, each of said substrates having a predetermined thickness and at least one smooth surface, wherein the first substrate has at least one bonding portion located on a surface thereof which is in contact with said intermediate bonding layer, the mount body having at least one recessed portion selectively formed in an exposed surface of said second substrate and said bonding layer to a depth which reaches said bonding portion of said first substrate; and an electronic part mounted in said recessed portion.

16. An electronic parts mounts device comprising:

a mount body which is obtained by bonding at least two substrates each having a predetermined thickness and a smooth surface, wherein one of said substrates has at least one bonding portion, said mount body having at least one recessed portion selectively formed in one exposed surface of said mount body to a depth which reaches said bonding portion;

an electronic part being machined to have a predetermined shape;

holding means for holding said mount body;

moving means for holding said electronic part and moving said electronic part to said recessed portion; and vibration generating means for applying a small vibration to at least one of said mount body and said electronic part.

17. An electronic parts mount device comprising:

a mount body which is obtained by bonding at least first and second substrates through an intermediate bonding layer, each of said substrates having a predetermined thickness and at least one smooth surface, wherein the first substrate has at least one bonding portion located on a surface thereof which is in contact with said intermediate bonding layer, said mount body having at least one recessed portion selectively formed in an exposed surface of said second substrate and said bonding layer to a depth which reaches said bonding portion of said first substrate;

an electronic part being machined to have a predetermined shape;

holding means for holding said mount body;

moving means for holding said electronic part and moving said electronic part to said recessed portion; and vibration generating means for applying a small vibration to at least one of said mount body and seaid electronic part.

18. An electronic parts mount device comprising:

a mount body which is obtained by bonding together at least first and second substrates through an intermediate bonding layer, each of said substrates having a predetermined thickness and at least one smooth surface, wherein the intermediate bonding layer has at least one bonding portion located on a surface thereof which is in contact with said second substrate, the mount body having at least one recessed portion selectively formed in an exposed surface of said second substrate to a depth which reaches said bonding portion of said intermediate bonding layer; and an electronic part mounted in said recessed portion.

* * * * *